(12) United States Patent
Chen

(10) Patent No.: US 8,970,040 B1
(45) Date of Patent: Mar. 3, 2015

(54) CONTACT STRUCTURE AND FORMING METHOD

(71) Applicant: Macronix International Co., Ltd., Hsinchu (TW)

(72) Inventor: Shih-Hung Chen, Jhudong Township, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/038,526

(22) Filed: Sep. 26, 2013

(51) Int. Cl.
| H01L 23/48 | (2006.01) |
| H01L 23/52 | (2006.01) |
| H01L 29/40 | (2006.01) |
| H01L 21/768 | (2006.01) |
| H01L 23/528 | (2006.01) |

(52) U.S. Cl.
CPC ........ H01L 21/76838 (2013.01); H01L 23/528 (2013.01)
USPC ..................... 257/758; 257/211; 257/E23.145

(58) Field of Classification Search
CPC ................. H01L 23/5226; H01L 2027/11885; H01L 2027/11887
USPC ................... 257/211, 758, 759, 760, E23.145
See application file for complete search history.

(56) References Cited

U.S. PATENT DOCUMENTS

| 6,034,882 | A | 3/2000 | Johnson et al. |
| 6,323,117 | B1 | 11/2001 | Noguchi |
| 6,906,361 | B2 | 6/2005 | Zhang |
| 6,906,940 | B1 | 6/2005 | Lue |
| 7,018,783 | B2 | 3/2006 | Iwasaki et al. |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,274,594 | B2 | 9/2007 | Pascucci et al. |

(Continued)

FOREIGN PATENT DOCUMENTS

| EP | 1936681 A1 | 6/2008 |
| EP | 2048709 A2 | 4/2009 |

(Continued)

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Hoai V Pham
(74) *Attorney, Agent, or Firm* — James F. Hann; Haynes Beffel & Wolfeld LLP

(57) ABSTRACT

A method for forming a contact structure includes forming a stack of alternating active layers and insulating layers. The stack includes first and second sub stacks each with active layers separated by insulating layers. The active layers of each sub stack include an upper boundary active layer. A sub stack insulating layer is formed between the first and second sub stacks with an etching time different from the etching times of the insulating layers for a given etching process. The upper boundary active layers are accessed, after which the remainder of the active layers are accessed to create a stairstep structure of landing areas on the active layers. Interlayer conductors are formed to extend to the landing areas, the interlayer conductors separated from one another by insulating material.

6 Claims, 47 Drawing Sheets

(56) References Cited

U.S. PATENT DOCUMENTS

| | | | |
|---|---|---|---|
| 7,315,474 | B2 | 1/2008 | Lue |
| 7,382,647 | B1 | 6/2008 | Gopalakrishnan |
| 7,420,242 | B2 | 9/2008 | Lung |
| 7,696,559 | B2 | 4/2010 | Arai et al. |
| 7,851,849 | B2 | 12/2010 | Kiyotoshi |
| 8,363,476 | B2 | 1/2013 | Lue et al. |
| 8,383,512 | B2 | 2/2013 | Chen et al. |
| 8,467,219 | B2 | 6/2013 | Lue |
| 8,503,213 | B2 | 8/2013 | Chen et al. |
| 8,736,069 | B2 | 5/2014 | Chiu et al. |
| 8,759,217 | B1 | 6/2014 | Chen |
| 8,759,899 | B1 | 6/2014 | Lue et al. |
| 2004/0023499 | A1 | 2/2004 | Hellig et al. |
| 2004/0188822 | A1 | 9/2004 | Hara |
| 2005/0280061 | A1 | 12/2005 | Lee |
| 2007/0045708 | A1 | 3/2007 | Lung |
| 2007/0090434 | A1 | 4/2007 | Davies et al. |
| 2007/0140001 | A1 | 6/2007 | Motoi et al. |
| 2007/0231750 | A1 | 10/2007 | Parikh |
| 2007/0252201 | A1 | 11/2007 | Kito et al. |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0175032 | A1 | 7/2008 | Tanaka et al. |
| 2008/0180994 | A1 | 7/2008 | Katsumata et al. |
| 2008/0247230 | A1 | 10/2008 | Lee et al. |
| 2008/0285350 | A1 | 11/2008 | Yeh |
| 2009/0001530 | A1 | 1/2009 | Goto |
| 2009/0032966 | A1 | 2/2009 | Lee et al. |
| 2009/0097321 | A1 | 4/2009 | Kim et al. |
| 2009/0184360 | A1 | 7/2009 | Jin et al. |
| 2010/0007001 | A1 | 1/2010 | Wang et al. |
| 2010/0054015 | A1 | 3/2010 | Lee et al. |
| 2010/0109164 | A1 | 5/2010 | Kang et al. |
| 2010/0133645 | A1 | 6/2010 | Dunne |
| 2010/0182041 | A1 | 7/2010 | Feng et al. |
| 2010/0225000 | A1 | 9/2010 | Sugizaki et al. |
| 2010/0270593 | A1 | 10/2010 | Lung et al. |
| 2011/0031630 | A1 | 2/2011 | Hashimoto |
| 2011/0057321 | A1 | 3/2011 | Wang et al. |
| 2011/0116309 | A1 | 5/2011 | Lung |
| 2011/0235408 | A1 | 9/2011 | Minemura et al. |
| 2012/0115309 | A1* | 5/2012 | Yoo et al. ............ 438/478 |
| 2012/0119283 | A1 | 5/2012 | Lee et al. |
| 2012/0182806 | A1 | 7/2012 | Chen et al. |
| 2013/0082341 | A1 | 4/2013 | Shimizu et al. |
| 2013/0341797 | A1 | 12/2013 | LIM |

FOREIGN PATENT DOCUMENTS

| | | |
|---|---|---|
| EP | 2192612 A2 | 6/2010 |
| TW | 1308374 B | 4/2009 |
| TW | 201123266 A | 7/2011 |

OTHER PUBLICATIONS

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Extended European Search Report for EP 12170759, dated Feb. 5, 2013, 12 pages.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, pp. 350-355, Jun. 13-18, 2010.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Nowak et al., "Intrinsic fluctuations in Vertical NAND flash memories," 2012 Symposium on VLSI Technology, Digest of Technical Papers, pp. 21-22, Jun. 12-14, 2012.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

CONTACT STRUCTURE AND FORMING METHOD

BACKGROUND

The present invention relates to high density devices. In particular, embodiments of the present invention provide methods for forming contact structure in which conductors connected to multiple active layers in a three-dimensional high density semiconductor device, such as memory device.

Three dimensional (3D) semiconductor devices are characterized by multiple layers forming a stack of alternating active layers and insulating layers. In a memory device, each of the layers can include a planar array of memory cells. For certain three-dimensionally stacked memory devices, active layers can comprise active strips of materials configured as bit lines or word lines for memory cells stacked in spaced-apart ridge-like structures. The active layers can be made from a doped (p-type or n-type) or undoped semiconductor material. In such 3D memory, memory cells can be disposed at the cross-points of the stacked bit lines or word lines and the crossing word lines or bit lines, forming a 3D memory array.

One way of connecting interlayer conductors to the active layers in the stack can be referred to as a multiple lithographic-etch process, disclosed in commonly owned U.S. Pat. No. 8,383,512, entitled Method for Making Multilayer Connection Structure, the disclosure of which is incorporated by reference. Another way of doing so, which can be referred to as a trim-etch process, is disclosed in commonly owned U.S. patent application Ser. No. 13/735,922, filed 7 Jan. 2013, entitled Method for Forming Interlayer Conductors to a Stack of Conductor Layers, the disclosure of which is incorporated by reference.

SUMMARY

An example of a method for forming a stairstep contact structure is carried out as follows. A stack of alternating active layers and insulating layers is formed by the following. A first sub stack is formed. The first stack includes N active layers separated by insulating layers, the N active layers including an upper boundary active layer. A second sub stack is formed over the first sub stack. The second sub stack includes M active layers separated by insulating layers, the M active layers including an upper boundary active layer. A first sub stack insulating layer is formed between the first and second sub stacks. The first sub stack insulating layer has an etching time different from the etching times of the insulating layers of the second sub stack for a given etching process. The upper boundary active layers are accessed. After accessing the upper boundary active layers, the remainder of the active layers of the first and second sub stacks are accessed create a stairstep structure of landing areas on the active layers of the first and second sub stacks. Interlayer conductors are formed to extend to the landing areas, the interlayer conductors separated from one another by insulating material.

An example of a method for forming a contact structure is carried out as follows. A stack of alternating active layers and insulating layers is formed. The stack includes sub stacks having upper boundary active layers, the sub stacks having insulating layer and active layer pairs below the upper boundary active layer. The insulating layer and active layer pairs constitute first layer pairs with uniform first sub stack etch times for a given etch process. The stack also includes second layer pairs, the second layer pairs including sub stack insulating layers between the sub stacks. The second layer pairs have second etch times for the given etch process different from the first sub stack etch times. A plurality of openings are etched in the stack, the openings stopping on the boundary layer active layers. Selected openings are etched to form vias that expose active layers inside each of the sub stacks. Interlayer conductors are formed (1) in the vias to extend to the active layers, and (2) in the openings that were not etched during the etching to deepen step to extend to upper boundary active layers.

An example of a stairstep contact structure includes a stack of alternating active layers and insulating layers having non-simple periods so that for the same etch process, at least one of (1) the active layers have different etch times, or (2) the insulating layers have different etch times. A stairstep structure of landing areas is on the active layers. Interlayer conductors extend to the stairstep structure of landing areas. The interlayer conductors are separated from one another by insulating material.

Other aspects and advantages of the technology are described with reference to the drawing in the detailed description and claims which follow.

BRIEF DESCRIPTION OF THE DRAWINGS

FIG. 7 shows a stack of active and insulating layers.

FIG. 8 shows the structure of FIG. 7 with a first etch mask.

FIG. 9 shows the structure of FIG. 8 after etching.

FIG. 10 shows the structure of FIG. 9 after removal of the first etch mask.

FIG. 11 shows the structure of FIG. 10 with a second etch mask.

FIG. 12 shows the structure of FIG. 11 after etching.

FIG. 13 shows the structure of FIG. 12 after removal of the second etch mask.

FIG. 14 shows the structure of FIG. 13 with a third etch mask.

FIG. 15 shows the structure of FIG. 14 after etching.

FIG. 16 shows the structure of FIG. 15 after removal of the third etch mask.

FIG. 17 shows the structure of FIG. 16 with a fourth etch mask.

FIG. 18 shows the structure of FIG. 17 after etching.

FIG. 19 shows the structure of FIG. 18 after removal of the fourth etch mask.

FIG. 20 shows the structure of FIG. 19 with a fifth etch mask.

FIG. 21 shows the structure of FIG. 20 after etching.

FIG. 22 shows the structure of FIG. 21 after removal of the fifth etch mask and showing vias formed in the stack.

FIG. 23 shows the structure of FIG. 22 after deposition of an insulating layer.

FIG. 24 shows the structure of FIG. 23 after removal of portions of the insulating layer leaving sidewall insulation within the vias.

FIG. 25 shows the structure of FIG. 24 with interconnect conductors creating the contact structure of FIG. 6.

FIG. 26 shows a stack of alternating active and insulating layers with a first etch mask.

FIG. 27 shows the structure of FIG. 26 after etching.

FIG. 28 shows the structure of FIG. 27 after replacing the first etch mask with a second etch mask.

FIG. 29 shows the structure of FIG. 28 after etching.

FIG. 30 shows the structure of FIG. 29 after removal of the second etch mask.

FIG. 31 shows the structure of FIG. 30 with a third etch mask.

FIG. 32 shows the structure of FIG. 31 after etching.

FIG. 33 shows the structure of FIG. 32 after a first trimming the third etch mask.

FIG. 34 shows the structure of FIG. 33 after etching.

FIG. 35 show the structure of FIG. 34 after a second trimming of the third etch mask.

FIG. 36 shows the structure of FIG. 35 after etching.

FIG. 37 shows the structure of FIG. 36 after removal of the trimmed third etch mask.

FIG. 38 shows the structure of FIG. 37 after depositing an insulating/stopping layer.

FIG. 39 shows the structure of FIG. 38 after depositing an insulating material.

FIG. 40 shows the structure of FIG. 38 with a fourth etch mask.

FIG. 41 shows the structure of FIG. 40 after etching.

FIG. 42 shows the structure of FIG. 41 after removal of the fourth etch mask and showing the vias formed in the structure.

FIG. 43 shows the structure of FIG. 42 with interlayer conductors within the vias.

DETAILED DESCRIPTION

Figure 1:
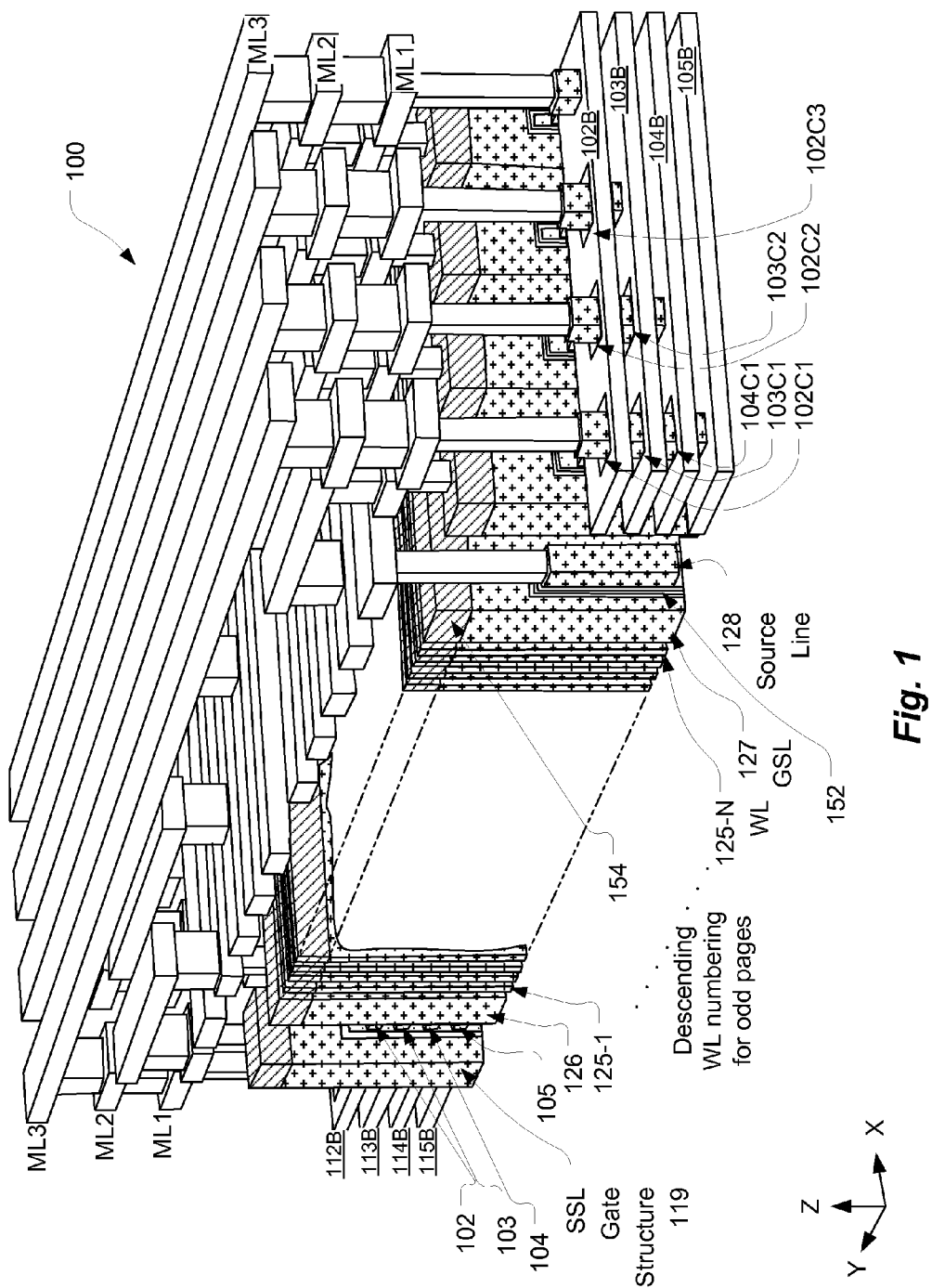
FIG. 1 is a perspective drawing of a semiconductor device including semiconductor pads for interlayer conductors.

A detailed description of various embodiments is described with reference to the figures. The following description will typically be with reference to specific structural embodiments and methods. It is to be understood that there is no intention to limit the invention to the specifically disclosed embodiments and methods, but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Unless otherwise stated, in this application, specified relationships, such as parallel to, aligned with, having uniform characteristics, or in the same plane as, mean that the specified relationships are within limitations of manufacturing processes and within manufacturing variations. When components are described as being coupled, connected, being in contact or contacting one another, they need not be physically directly touching one another unless specifically described as such. Like elements in various embodiments are commonly referred to with like reference numerals.

FIG. 1 is a perspective view of an example of a 3D semiconductor device (for example, a memory device) 100 as described in commonly owned U.S. Patent Publication No. 2012/0182806, filed Apr. 1, 2011, entitled Memory Architecture of 3D Array With Alternating Memory String Orientation and String Select Structures. Various insulating materials are formed but not shown to better illustrate active layers, including semiconductor strips and semiconductor pads for connecting to interlayer conductors, and others. 3D semiconductor device 100 is formed overlying a substrate (not shown) having an insulating layer (not shown) formed thereon. The substrate can include one or more integrated circuits and other structures. Four semiconductor pads 102B, 103B, 104B, and 105B on a proximal end of a stack of active layers and four semiconductor pads 112B, 113B, 114B, and 115B on a distal end of the stack, are shown, but the number of active layers and the corresponding semiconductor pads can be extended to any number of layers N, where N is an integer having a value greater than one. As shown, the 3D semiconductor device 100 includes stacks of active strips (e.g. 102, 103, 104, 105) separated by insulating material. Semiconductor pads (e.g. 102B, 103B, 104B, and 105B) terminate the strips in corresponding active layers. As illustrated, the semiconductor pads 102B, 103B, 104B, and 105B are electrically coupled to the active layers for connection to decoding circuitry to select layers within the array. Semiconductor pads 102B, 103B, 104B, and 105B can be patterned concurrently as the active layers are patterned, with the possible exception of vias for the interlayer conductors. Each of the active strips includes a semiconductor material suitable to act as a channel region in the illustrated embodiment. The strips are ridge-shaped extending on the Y-axis as illustrated, so that the active strips 102, 103, 104, 105 can be configured as bodies including channel regions of flash memory cell strings, for example, in horizontal NAND string configurations. As illustrated, a layer 152 of memory material coats the plurality of stacks of active strips in this example, and at least on the side walls of the active strips in other examples. In other embodiments, the active strips can be configured as word lines for vertical NAND string configurations. See, for example, commonly owned U.S. Pat. No. 8,363,476, filed 19 Jan. 2011, entitled Memory Device, Manufacturing Method and Operating Method of the Same.

Each stack of active strips is terminated at one end by semiconductor pads and the other end by a source line. Therefore, active strips 102, 103, 104, 105 terminate on the proximal end by semiconductor pads 102B, 103B, 104B, and 105B and a source line terminal 119 on the distal end of the strips passing through gate select line 127. Active strips 112, 113, 114, 115 terminate on the distal end by semiconductor pads 112B, 113B, 114B, and 115B and a source line terminal (for example, source line 128) passing through gate select line 126 near the proximal end of the strips.

In the embodiment of FIG. 1, a plurality of conductors 125-1 through 125-N is arranged orthogonally over the plurality of stacks of active strips. The conductors 125-1 through 125-N, have surfaces conformal with the plurality of stacks of active strips, within the trenches defined by the plurality of stacks, and defining a multilayer array of interface regions at cross-points between side surfaces of the active strips 102, 103, 104, 105 on the stacks and conductors 125-1 through 125-N (for example, word lines or source select lines). As shown, a layer of silicide (e.g. tungsten silicide, cobalt silicide, titanium silicide or nickel silicide) 154 can be formed over the top surfaces of conductors (for example, word lines or source select lines).

Depending upon the implementation, layer 152 of memory material can comprise multilayer dielectric charge storage structures. For example, a multilayer dielectric charge storage structure includes a tunneling layer comprising a silicon oxide, a charge trapping layer comprising a silicon nitride, and a blocking layer comprising a silicon oxide. In some examples, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 152 of memory material can comprise only a charge trapping layer without the tunneling layer or the blocking layer.

In the alternative, an anti-fuse material such as a silicon dioxide, silicon oxynitride or other silicon oxides, for example, having a thickness on the order of 1 to 5 nanometers, can be utilized. Other anti-fuse materials may be used, such as silicon nitride. For anti-fuse embodiments, active strips 102, 103, 104, 105 can be a semiconductor material with a first conductivity type (e.g. p-type). Conductors (for example, word lines or source select lines) 125-N can be a semiconductor material with a second conductivity type (e.g. n-type). For example, the active strips 102, 103, 104, 105 can be made using p-type polysilicon while the conductors 125-N can be made using relatively heavily doped n+-type polysilicon. For anti-fuse embodiments, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other embodiments, different programmable resistance memory materials can be used as the memory material, including metal oxides like tungsten oxide on tungsten or doped metal oxide, and others. Some of such materials can form devices that can be programmed and erased at multiple voltages or currents, and can be implemented for operations for storing multiple bits per cell.

As can be seen in FIG. 1, the semiconductor pads 102B, 103B, 104B, and 105B are coupled on one side to active strips in the corresponding layer of the device, such as by being formed of a continuous patterned layer of semiconductor. In some embodiments, the pad can be coupled on two sides to active strips in the corresponding layer. In other embodiments, the pads can be connected to the active strips using other materials and structures that allow for electrical communication of the voltages and currents needed for operation of the device. Also, an overlying insulator layer (not shown) and semiconductor pads 102B, 103B, 104B, 105B, except the lowermost pad, include openings 102C1, 102C2, 102C3, 103C1, 103C2, 104C1, that expose landing areas on underlying pads forming a stairstep structure in this example.

One way of connecting interlayer conductors to the active layers in the stack can be referred to as a multiple lithographic-etch process, disclosed in commonly owned U.S. Pat. No. 8,383,512, entitled Method for Making Multilayer Connection Structure, the disclosure of which is incorporated by reference. Another way of doing so, which can be referred to as a trim-etch process, is disclosed in commonly owned U.S. patent application Ser. No. 13/735, 922, filed 7 Jan. 2013, entitled Method for Forming Interlayer Conductors to a Stack of Conductor Layers, the disclosure of which is incorporated by reference.

Figure 2A:
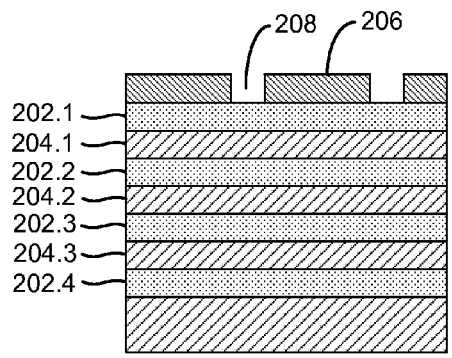
FIGS. 2A, 2B, 2C, 2D, 2E and 2F are simplified views of the process steps performed for an example of a multiple lithographic-etch process when the stack has a simple period.
Figure 2B:
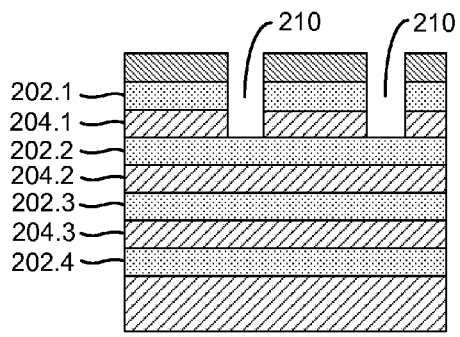
Figure 2C:
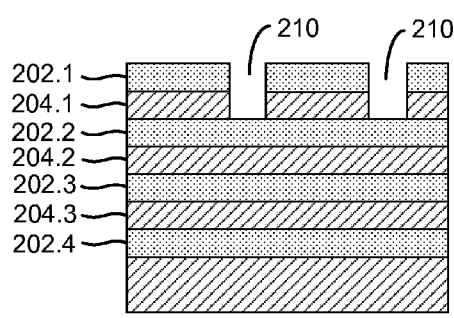
Figure 2D:
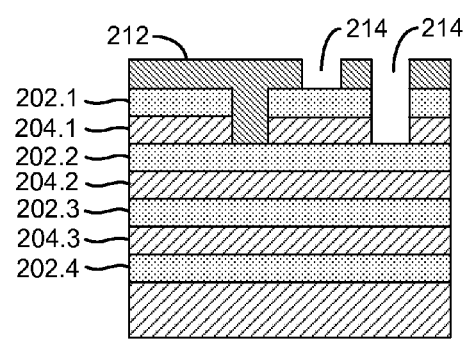
Figure 2E:
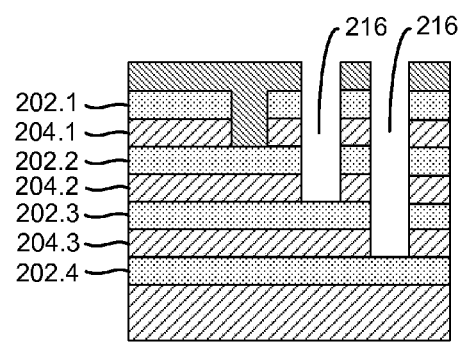
Figure 2F:
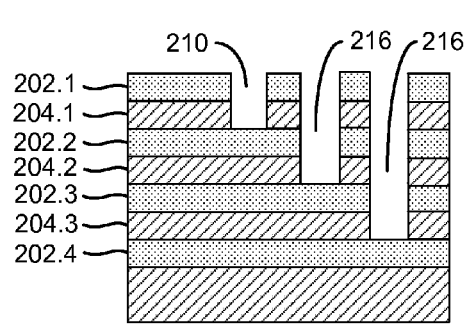
Figure 3A:
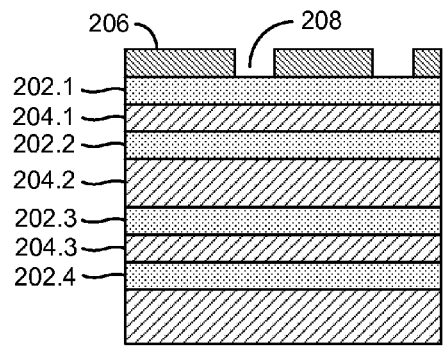
FIGS. 3A, 3B, 3C, 3D and 3E are simplified views a multiple lithographic-etch process when the stack has a non-simple period illustrating etching depth problems created during the process.
Figure 3B:
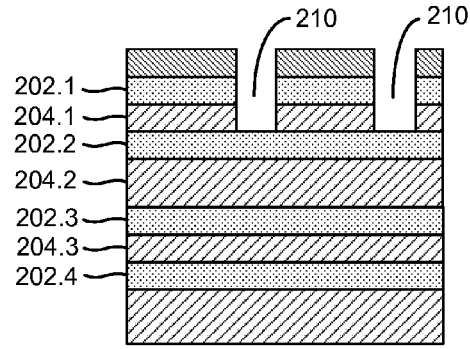
Figure 3C:
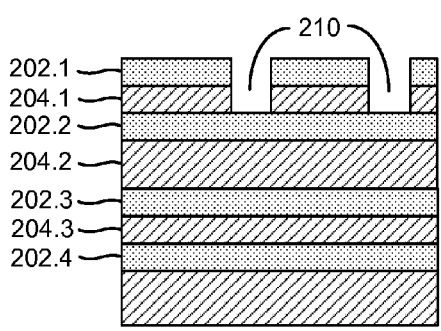
Figure 3D:
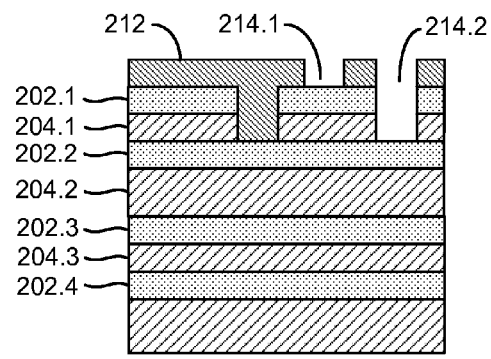
Figure 3E:
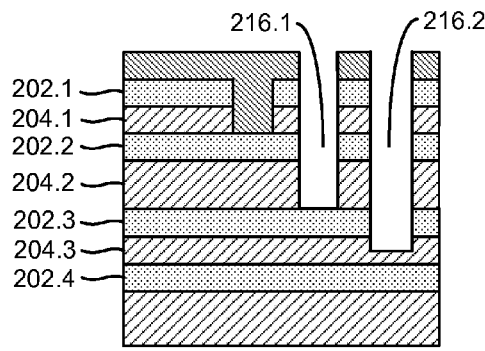

FIGS. 2A-2F illustrate a simplified example of a multiple lithographic-etch process used to make a contact structure. FIG. 2A shows a stack 200 of alternating active layers 202 and insulating layers 204 with a first etch mask 206 formed on the uppermost active layer 202.1. First etch mask 206 has first etch masks openings 208. FIG. 2B shows the structure of FIG. 2A after etching through one level, that is one active layer 202 and one insulating layer 204. This first etching takes place at the first etch mask openings 208 to create first etch openings 210. After stripping of first etch mask 206, see FIG. 2C, a second etch mask 212 is formed over the stack 200, see FIG. 2D. Second etch mask to 12 has second etch mask openings 214, one being aligned with a first etch masks opening 208 and the other not. Next, as shown in FIG. 2E, a second etching takes place through two levels. The result is formation of vias and extending to the second, third and fourth active layers 202.2, 202.3 and 202.4 with the first active layer 202.1 being exposed by the removal of second etch mask 212 as illustrated in FIG. 2F.

Stack 200 is made of active layers 202 having common etching characteristics and insulating layers 204 having common etching characteristics. In this example, active layers 202 are made of the same conductive material and have the same nominal thickness. Likewise, insulating layers 204 are made of the same insulating material with the same nominal thickness. Therefore each pair of insulating layer and active layer will have a uniform etch time for a given etch process. This arrangement of the pairs of insulating and active layers can be referred to as stacked layers with a simple period.

FIGS. 3A-3D illustrate an example similar to that of FIGS. 2A-2F in which the stacked layers do not have a simple period. In this case, the third insulating layer 204.3 is thicker than either of insulating layers 204.1 or 204.2 above it. Therefore, the time it would take to etch through first, upper boundary active layer 202.1, first insulating layer 204.1, second active layer 202.4 and second insulating layer 204.2 at second etch masks opening 214.1 would only be sufficient to etch part way through third insulating layer 204.3 at second etch masks opening 214.2.

As described herein, structures are provided that have non-simple periods, in which the active and/or insulating layers have different etch times, typically because the active and/or insulating layers are made of different materials with different etching characteristics, or different thicknesses, or a combination of different materials and different thicknesses for the active and/or insulating layers.

Figure 4A:
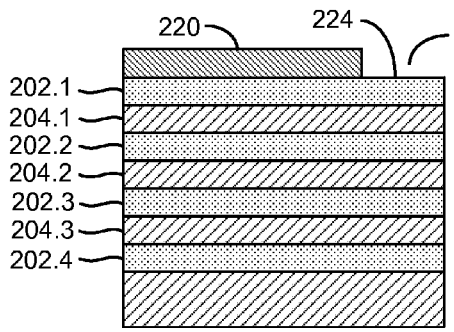
FIGS. 4A, 4B, 4C, 4D, 4E, 4F and 4G are simplified views of the process steps performed for an example of a trim-etch process when the stack has a simple period.
Figure 4B:
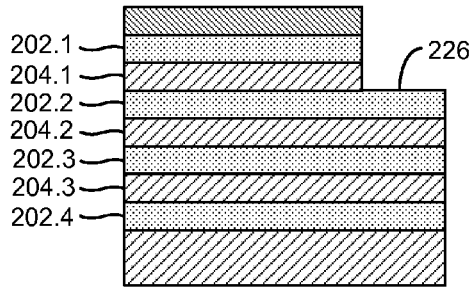
Figure 4C:
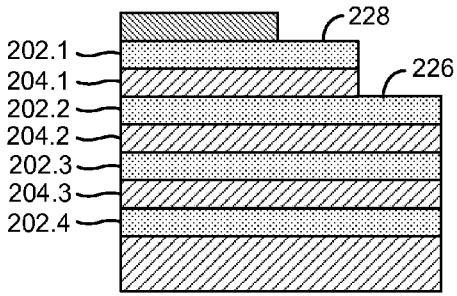
Figure 4D:
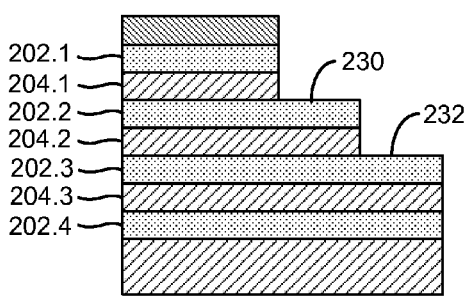
Figure 4E:
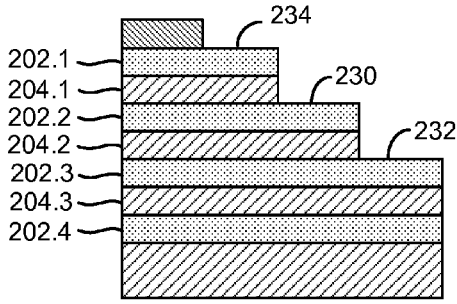
Figure 4F:
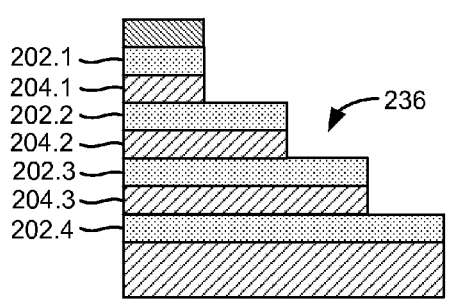
Figure 4G:
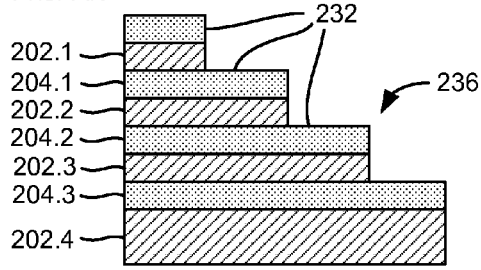

FIGS. 4A-4G illustrate a simplified example of a trim-etch process. An etch mask 220 is formed on the uppermost active layer 202.1 with an etch masks opening 222 exposing a portion 224 of the uppermost active layer. A first etching step etches through active layer 202.1 and insulating layer 204.1 to expose a portion 226 of active layer 202.2 as shown in FIG. 4B. Next, during a first trim step, a portion of etch mask 220 is removed to expose another portion 228 of active layer 202.1. The next etching step, shown in FIG. 4D, etches through one active layer 202 and one insulating layer 204 to expose a portion 230 of active layer 202.2 and a portion 232 of active layer 202.3. Next, during a second trim step, see FIG. 4E, a portion of etch mask 220 is removed exposing a portion 234 of active layer 202.1. This is followed by another etch step, see FIG. 4F, through one active layer and one insulating layer at each of portions 234, 230 and 232 to create the structure of FIG. 4F. FIG. 4G shows the structure of FIG. 4F after stripping the remainder of etch mask 220 to create a stairstep structure 236 having a number of landing areas 238 at the different active layers 202.1-202.4 for connection with interlayer conductors.

Figure 5A:
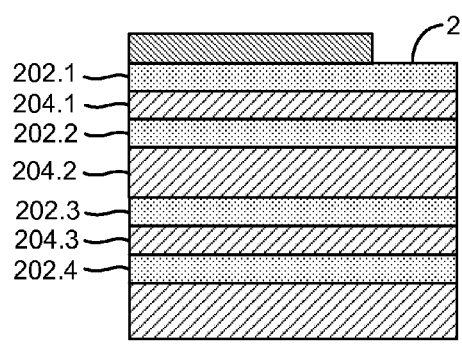
FIGS. 5A, 5B, 5C and 5D are simplified views of a trim-etch process when the stack has the non-simple period illustrating etching depth problems created during the process.
Figure 5B:
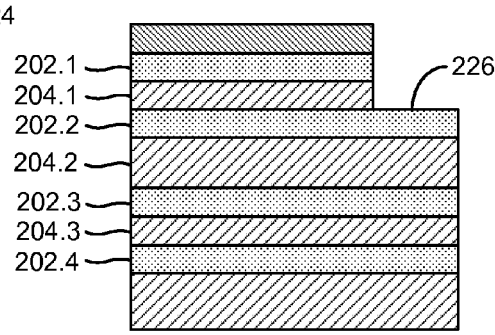
Figure 5C:
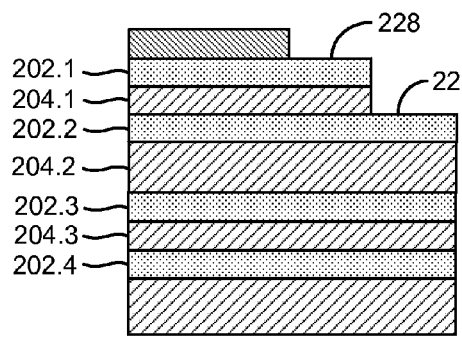
Figure 5D:
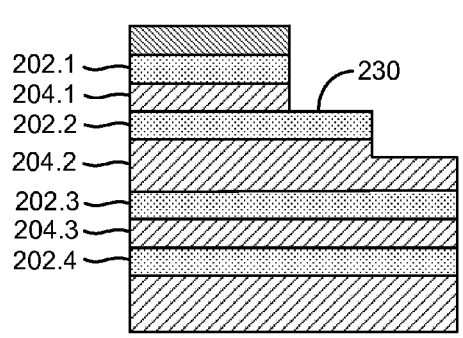

FIGS. 5A-5D illustrate an example similar to that of FIGS. 4A-4G in which the stacked layers do not have a simple period. In this example, the second insulating layer 204.2 is much thicker than either of insulating layers below or above it. During the etching step of FIG. 5D, which corresponds to the etching step of FIG. 4D, etching is sufficient to etch portion 228 of active layer 202.1 and is the portion of underlying insulating layer 204.1 to expose portion 230 of active layer 202.2. However, as illustrated in FIG. 5D, such etching is only sufficient to etch part way through the second insulating layer 204.2 because it is greater thickness takes longer to etch through. Therefore, unlike FIG. 4D, the third active layer 202.3 is not exposed by the second etching step. However, continuing the second etching step to etch through second insulating layer 204.2 until third active layer 202.3 is exposed can damage or destroy expose portion 230 of active layer 202.2.

Figure 6:
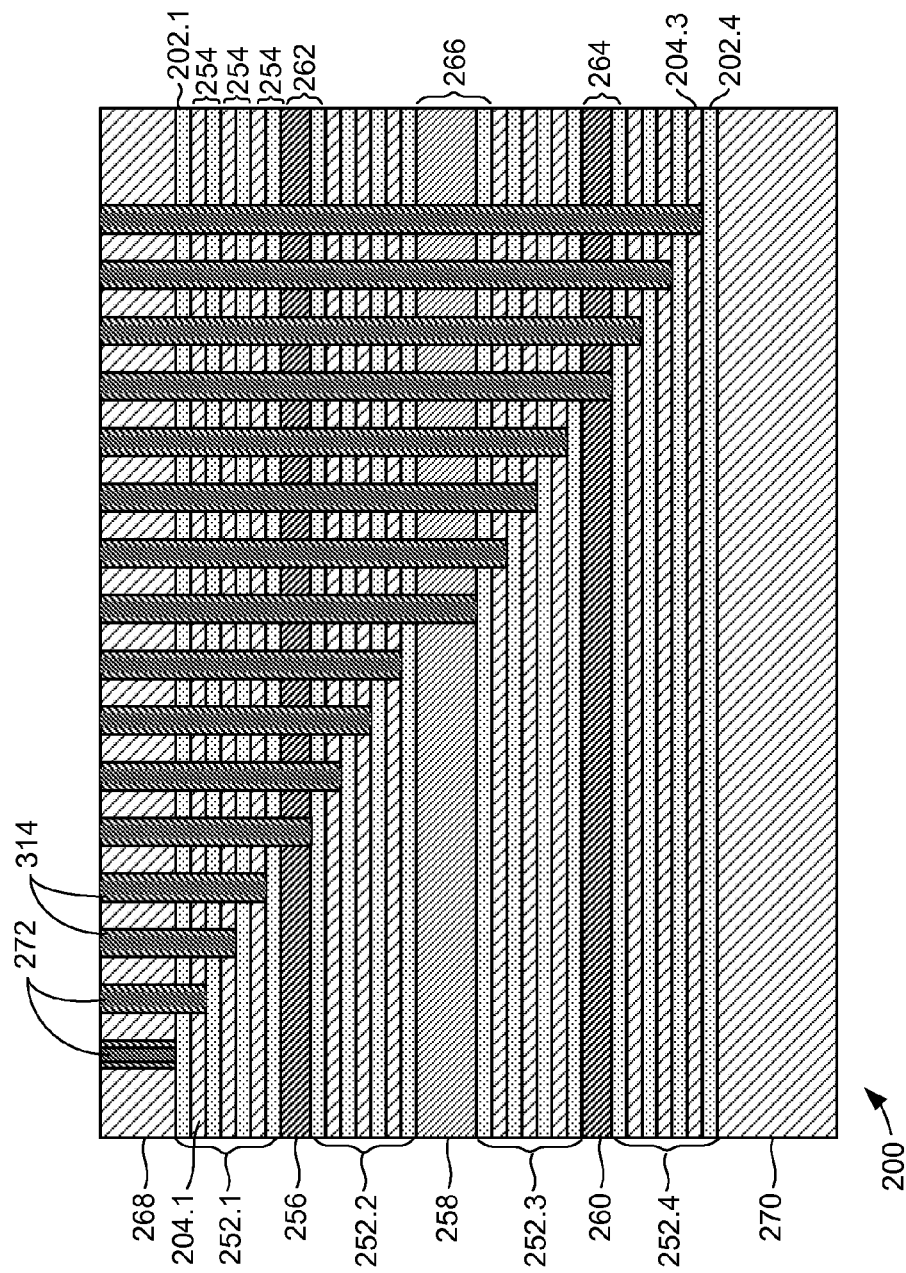
FIG. 6 is an example of a contact structure including a stack of alternating active and insulating layers which do not have a simple period.

With that as a background, an example of a contact structure 250 in which the stack of active and insulating layers do not have a simple period is shown in FIG. 6. Contact structure 250 includes a stack 200 of alternating active layers 202 and insulating layers 204. Stack 200 also includes sub stacks 252 having upper boundary active layers 202.1. The sub stacks 252 also include the first layer pairs 254 of insulating and active layers 202, 204 below each upper boundary active layer 202.1. In the example of FIG. 6, there are four sub stacks 252 labeled 252.1 through 252.4. Pairs 254 of insulating and active layers 202, 204 have uniform, first etch times for a given etch process. Stack 200 also includes sub stack insulating layers 256, 258 and 260 between the sub stacks 252. In this example, the composition of insulating layers 256, 258 and 260 is the same, typically silicon dioxide SiO2 while the composition of sub stack insulating layer 258 is different, such as silicon nitride SiN. Thickness and composition of sub stack insulating layers 256 and 260 are substantially the same so that each has substantially the same etching characteristics. However, the thickness of insulating layers 256 and 260 is greater than the thickness of insulating layers 204 so that the time to etch through insulating layers 256 and 260 is greater than the time it takes to etch through an insulating layer 204 for a given etch process.

Sub stack insulating layer 256 and the underlying, adjacent active layer 202.1 constitute a second layer pair 262 having a second etch time for the given etch process. Sub stack insulating layer 260 and the underlying, adjacent active layer 202.1 constitute a third layer pair 264, also having the second etch time for the given etch process. Sub stack insulating layer 258 and the underlying, adjacent active layer 202.1 constitute a fourth layer pair 266 having a fourth etch time different from any of the first through third etch times. Etch times for the different layer pairs 254, 262, 264, 266 can be made the same or different using a wide range of different materials having different etch rates together with the same or different thickness of the insulating and active layers.

Contact structure 250 also includes an upper insulating layer 268 overlying active layer 202.1 of stack 252.1 and a lower insulating layer 270 underlying active layer 202.4 of sub stack 252.4; both can made of silicon dioxide. A set of interlayer conductors 272 extend through upper insulating layer 268 to make contact with each active layer 202 of each sub stack 252 in a stairstep fashion. Each interlayer conductor 272 is surrounded by sidewall insulation 274, which can be made of silicon nitride.

FIGS. 7-25 will be discussed showing one example of steps for making the contact structure 250 of FIG. 6 using a multi-lithographic etching process, such as discussed with regard to FIGS. 2A-2F.

Figure 7:
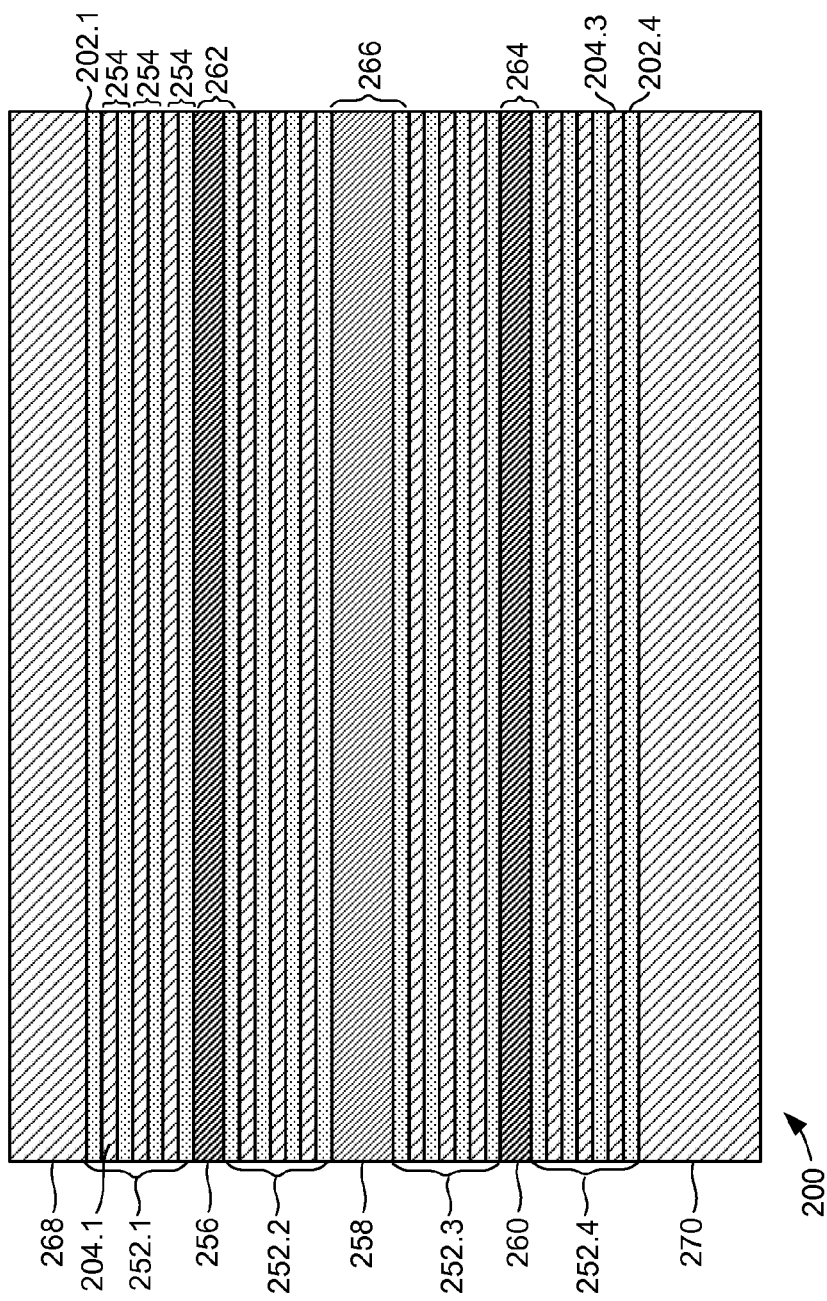
FIGS. 7-25 show an example for making the contact structure of FIG. 6 using a multi-lithographic etching process.
Figure 8:
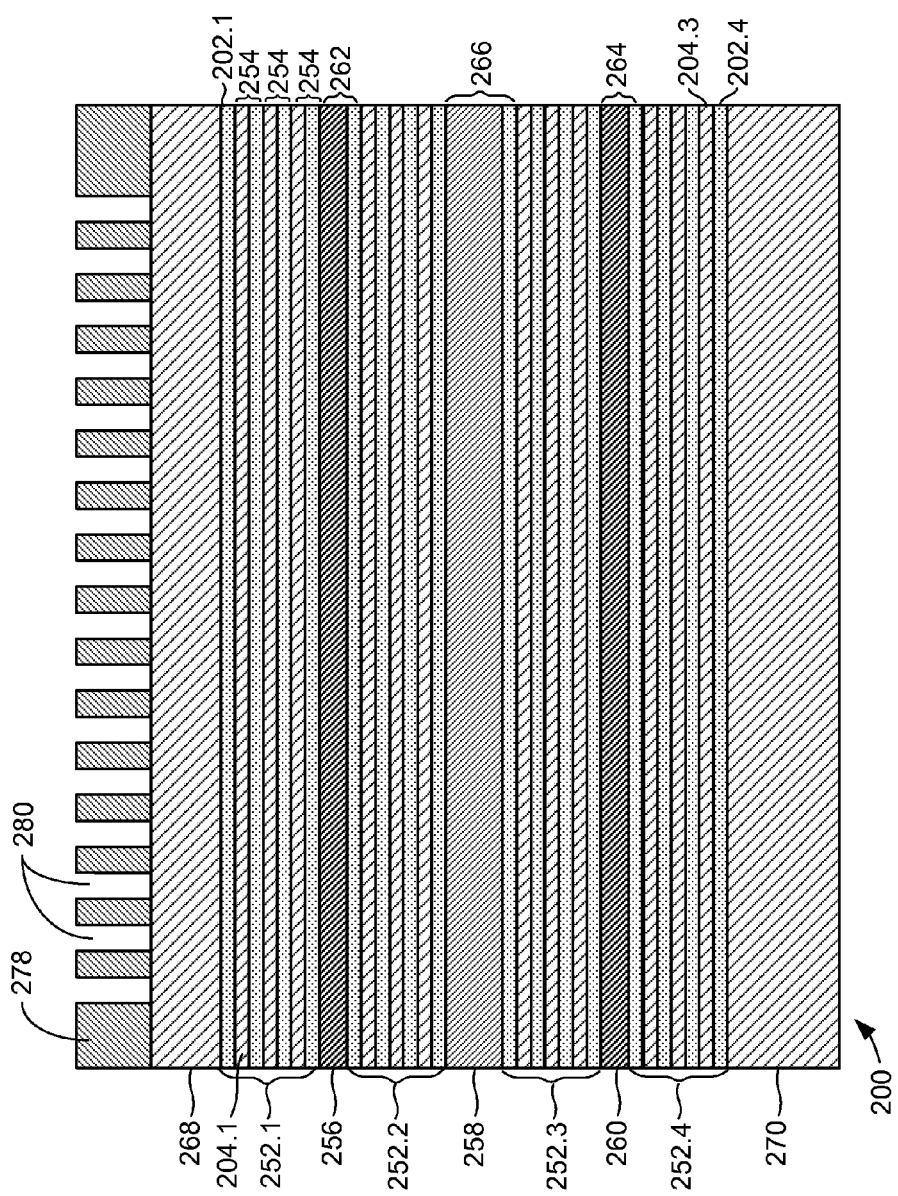
Figure 9:
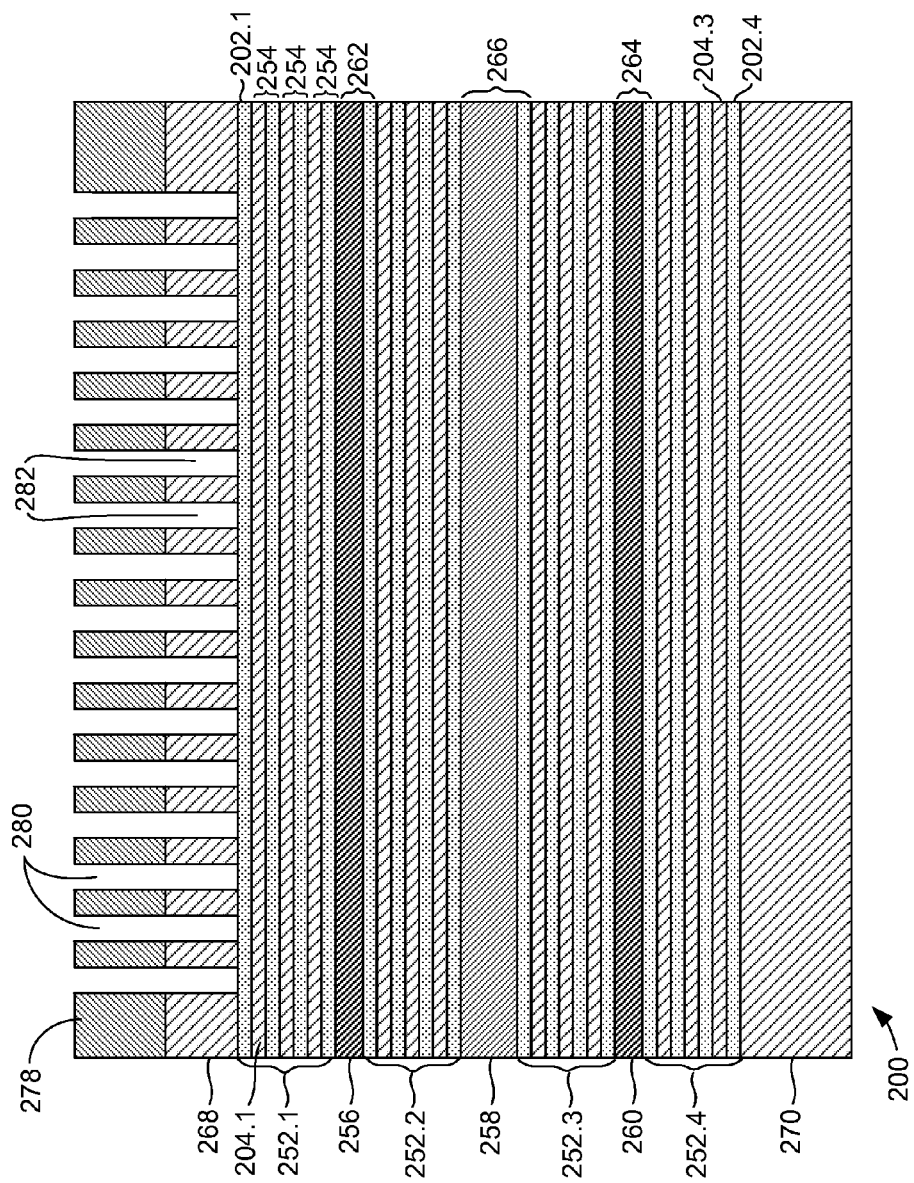
Figure 10:
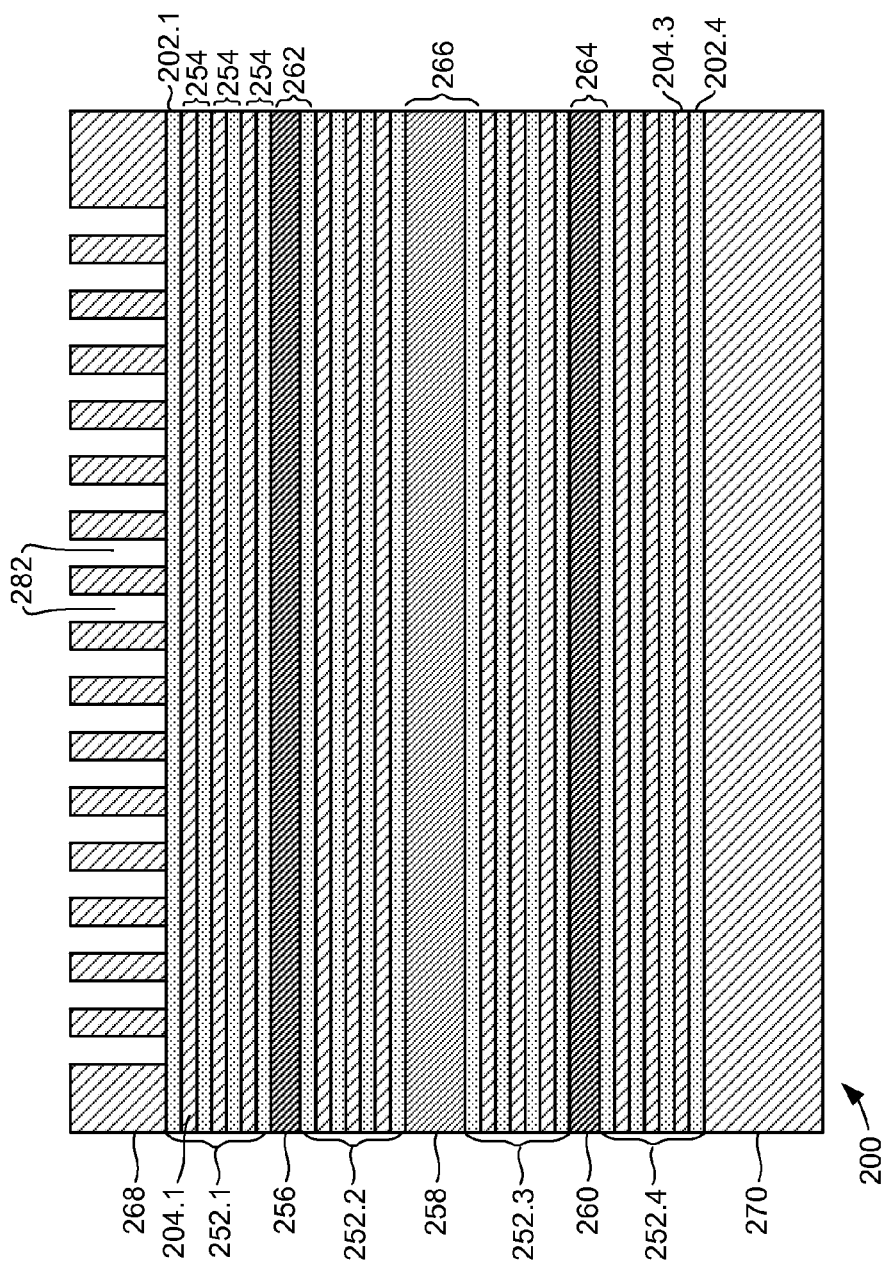

FIG. 7 shows stack 200 including sub stacks 252.1-252.4 between upper insulating layer 268 and lower insulating layer 270, the sub stacks separated by sub stack insulating layers 256, 258, 260. FIG. 8 shows the structure of FIG. 7 with a first etch mask 278 with first etch mask openings 280 formed therein. FIG. 9 shows a result of etching the structure of FIG. 8 at openings 280 through upper insulating layer 268 to create first etched openings 282 within layer 268 down to the upper boundary active layer 202.1 of sub stack 252.1. FIG. 10 shows the structure of FIG. 9 after first etch mask 278 has been stripped.

Figure 11:
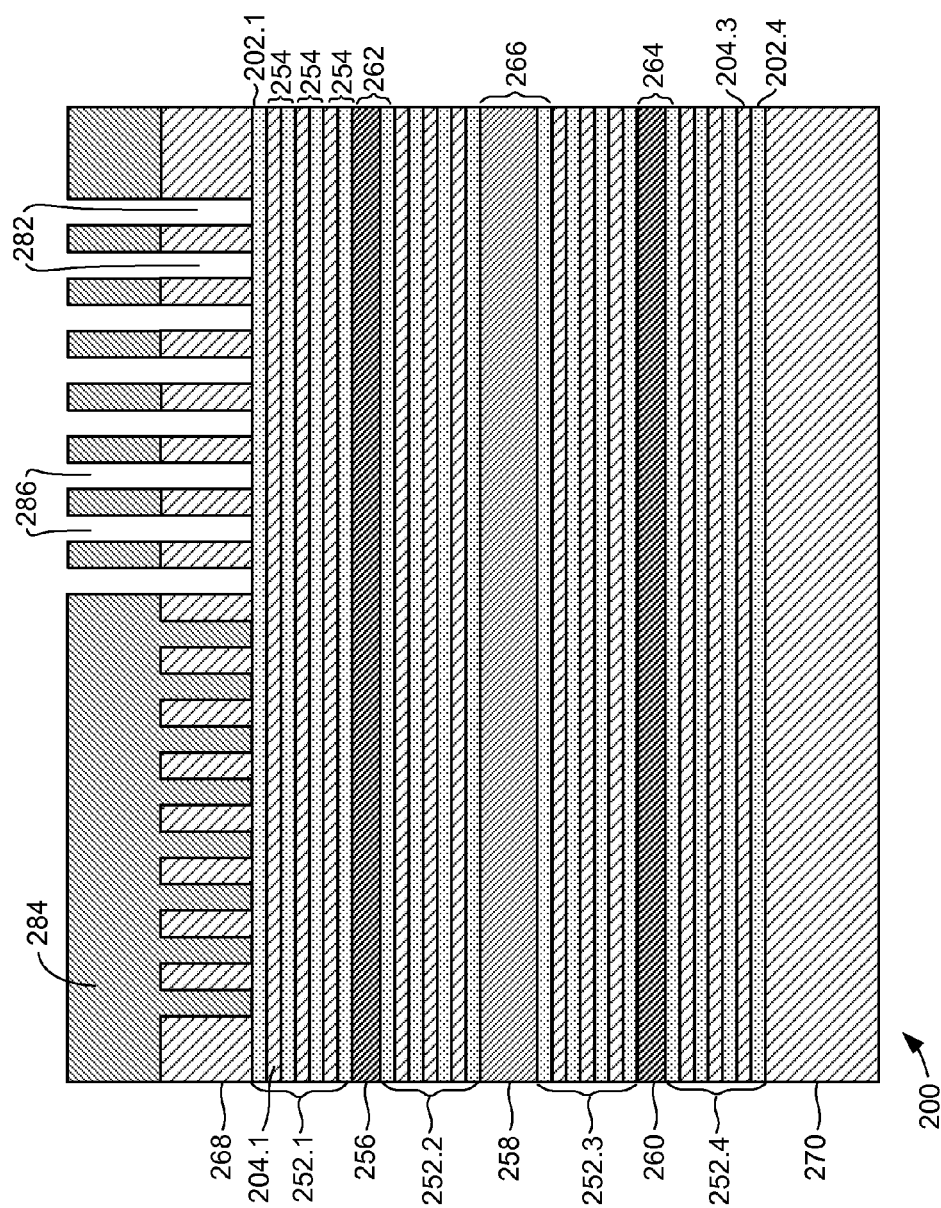
Figure 12:
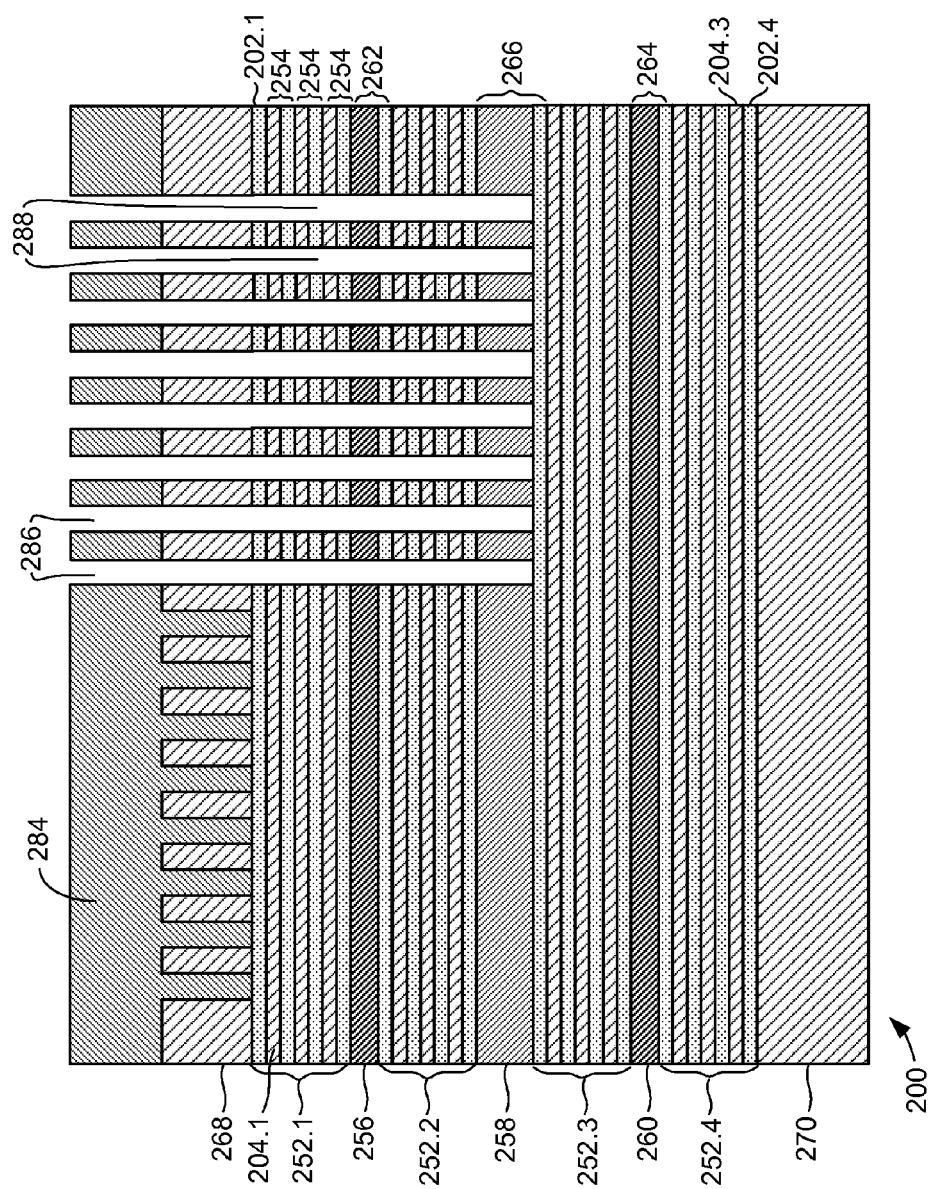
Figure 13:
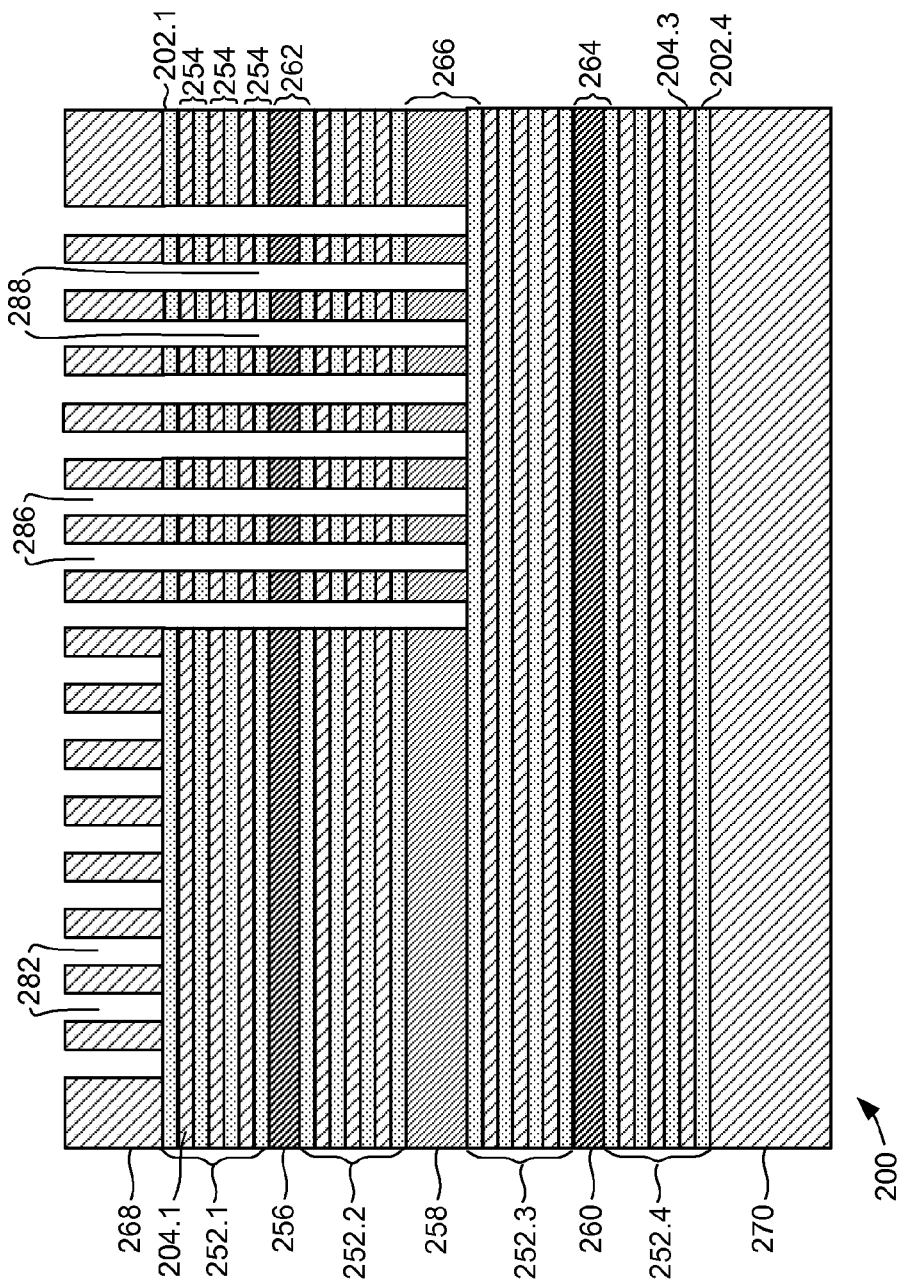

FIG. 11 shows the structure of FIG. 10 after forming a second etch mask 284 covering half of the first etched openings 282 and having second etch mask openings 286 aligned with the other half of etched openings 282. In FIG. 12, the structure of FIG. 11 is etched through openings 286 to create second etched openings 288 down to an upper boundary active layer 202.1 of sub stack 252.3. In FIG. 13, second etch mask 284 has been stripped exposing first etched openings 282.

Figure 14:
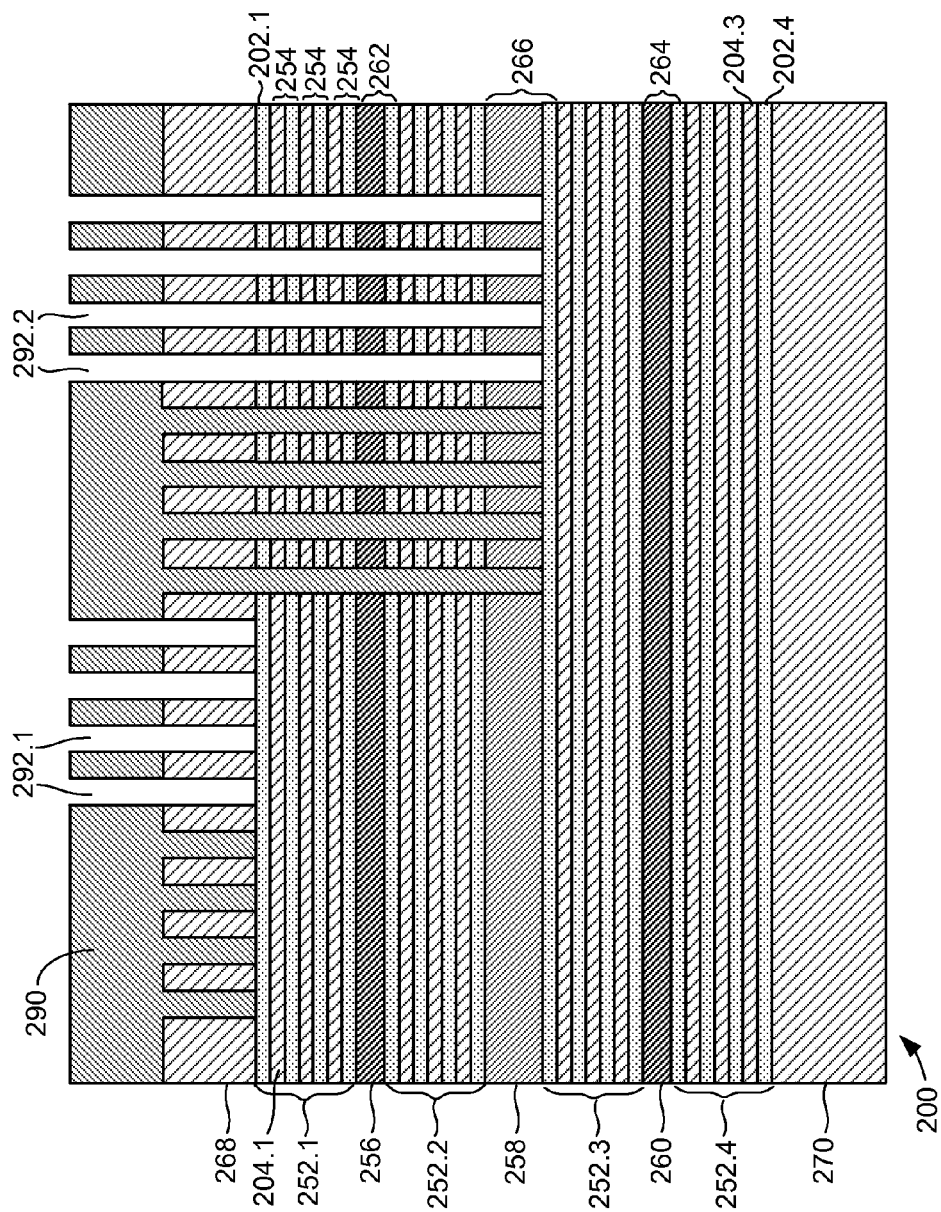
Figure 15:
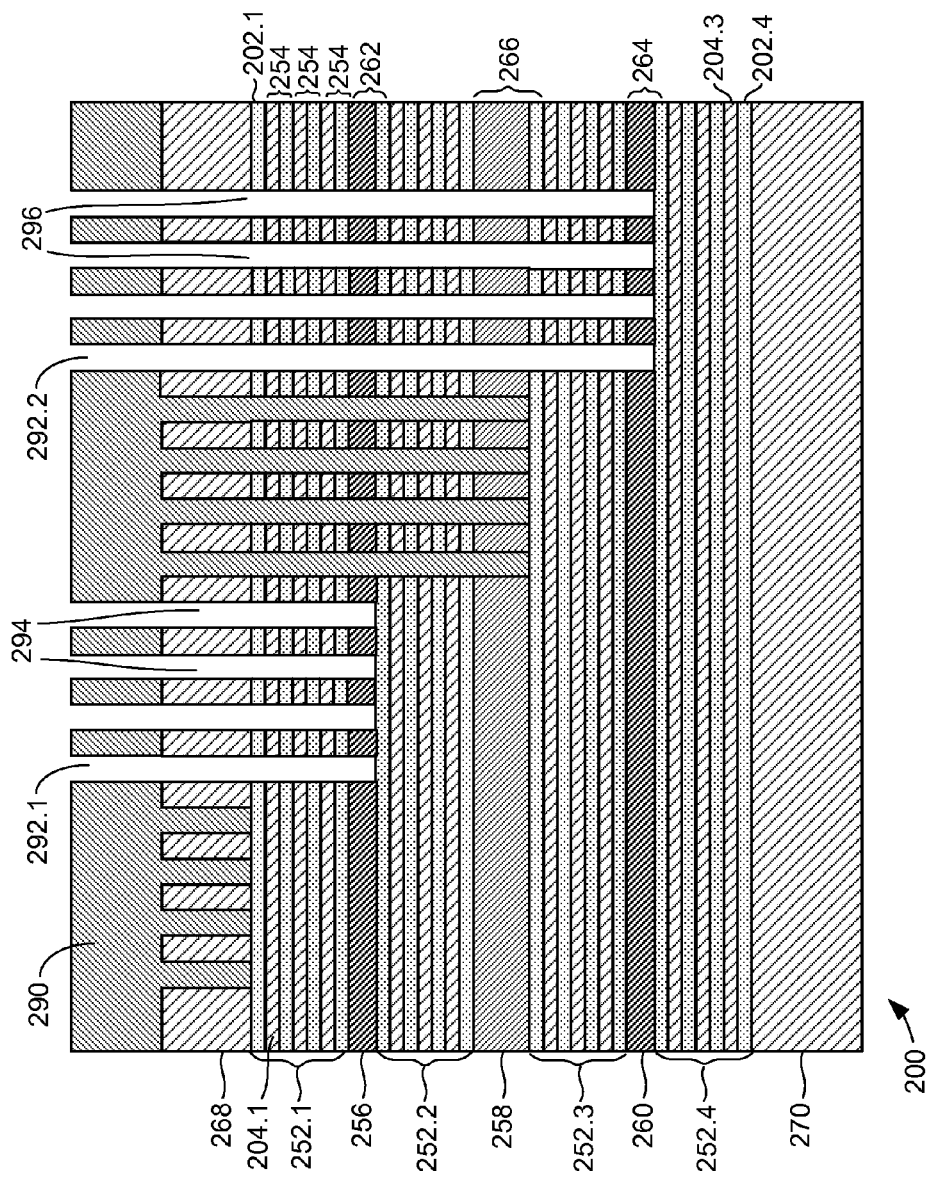
Figure 16:
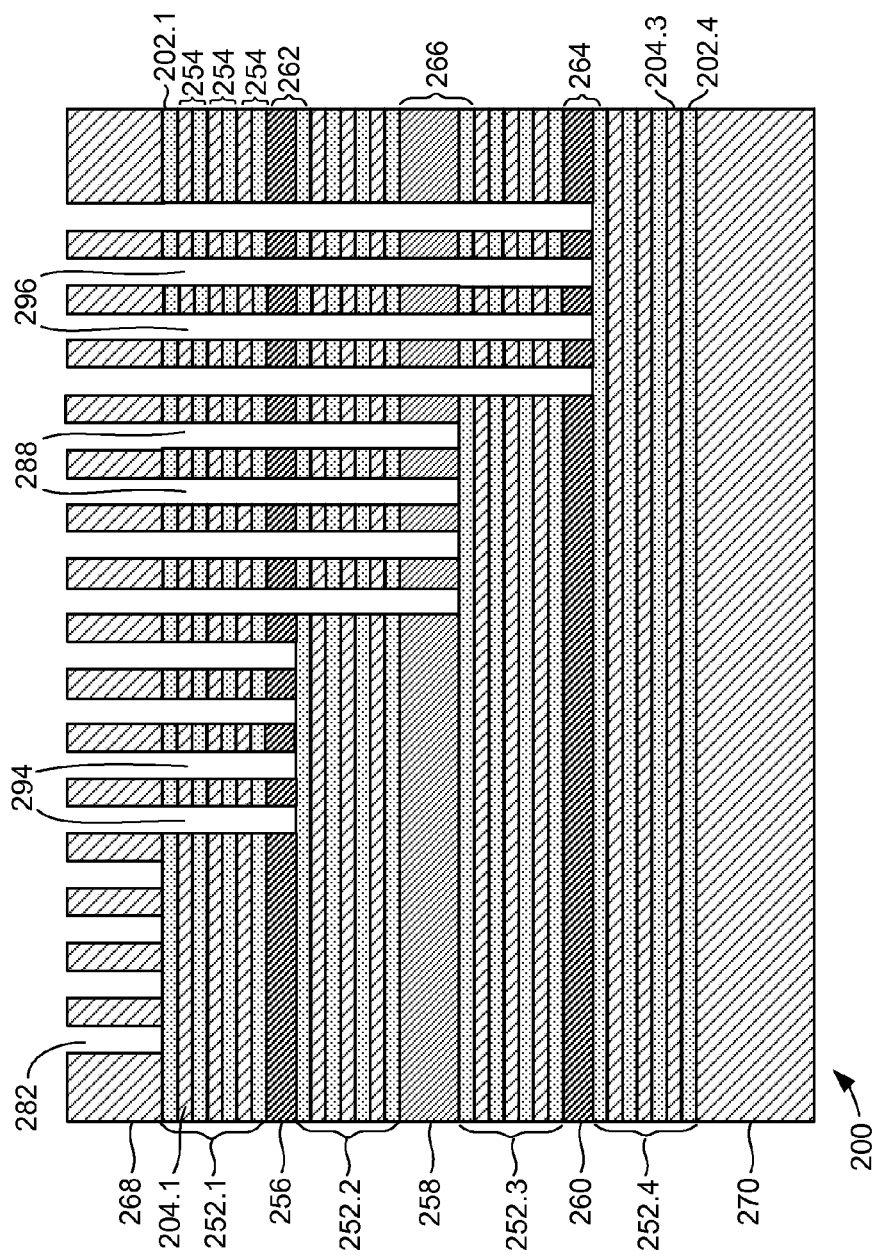

FIG. 14 shows the structure of FIG. 13 after forming a third etch mask 290 having third etch mask openings 292.1 exposing half of first etched openings 282 and third etch mask openings 292.2 exposing half of the second etched openings 288. FIG. 15 shows the structure of FIG. 14 after etching through first sub stack 252.1 and sub stack insulating layer 256 at third etch mask openings 292.1. FIG. 15 also shows a result of etching through third sub stack 252.3 and sub stack insulating layer 260 at third etch mask openings 292.2. Doing so creates third etched openings 294 and fourth etched openings 296. FIG. 16 shows the structure of FIG. 15 after third etch mask 290 has been stripped.

Figure 17:
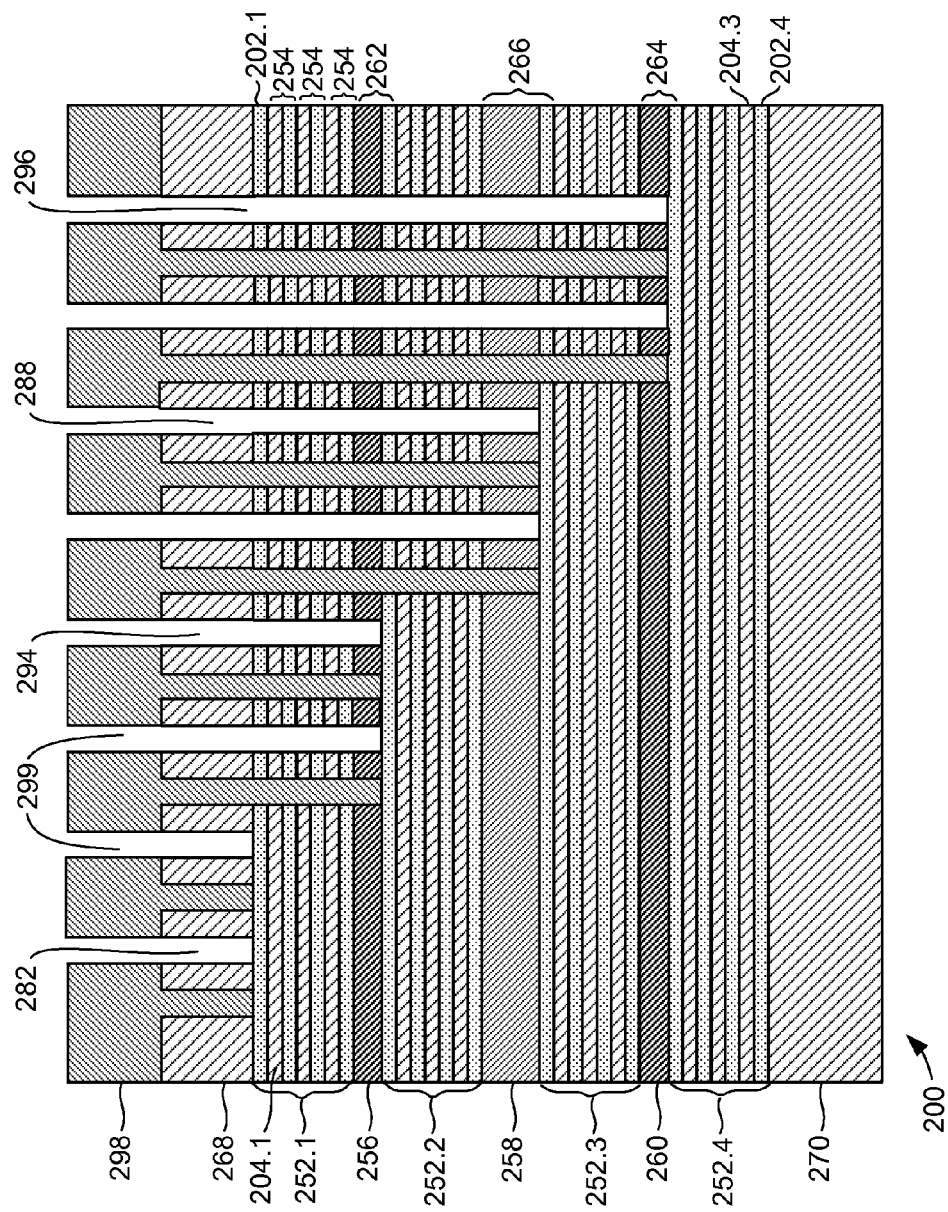
Figure 18:
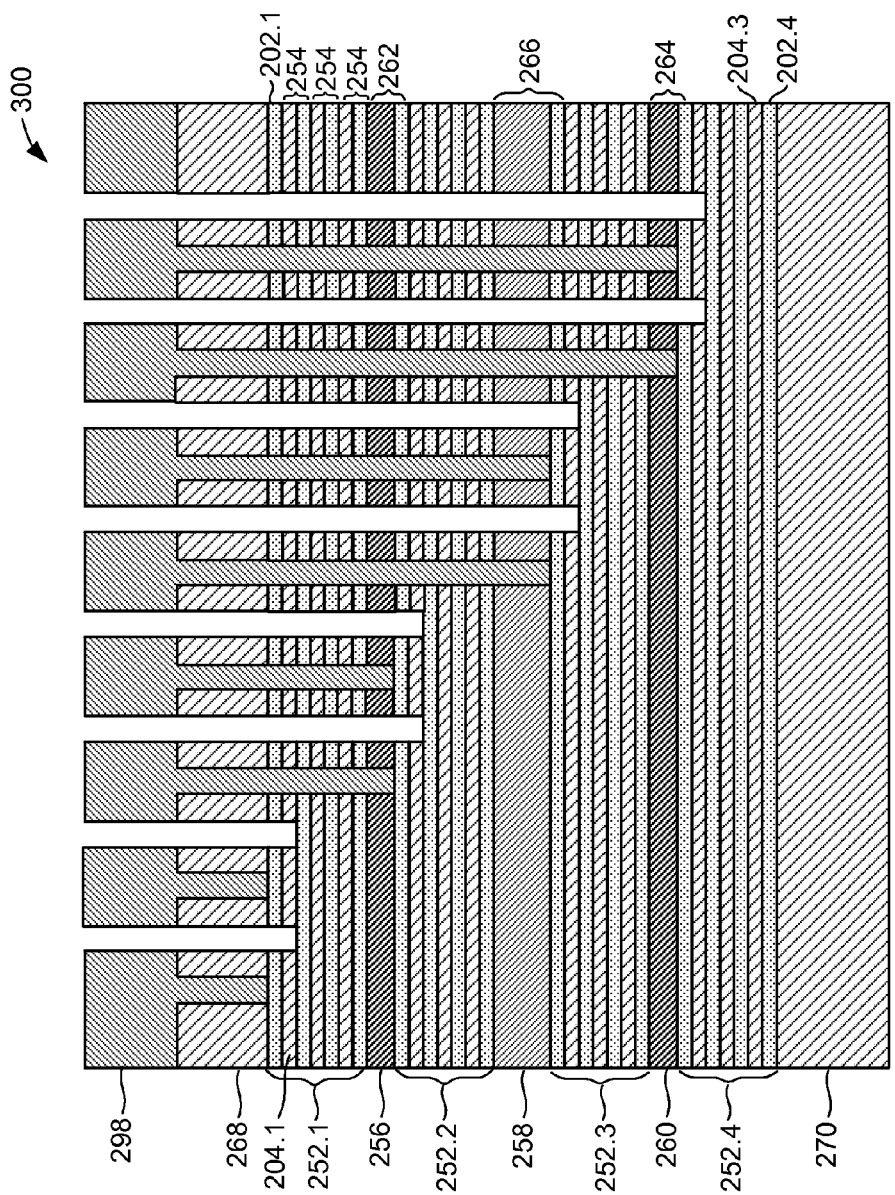
Figure 19:
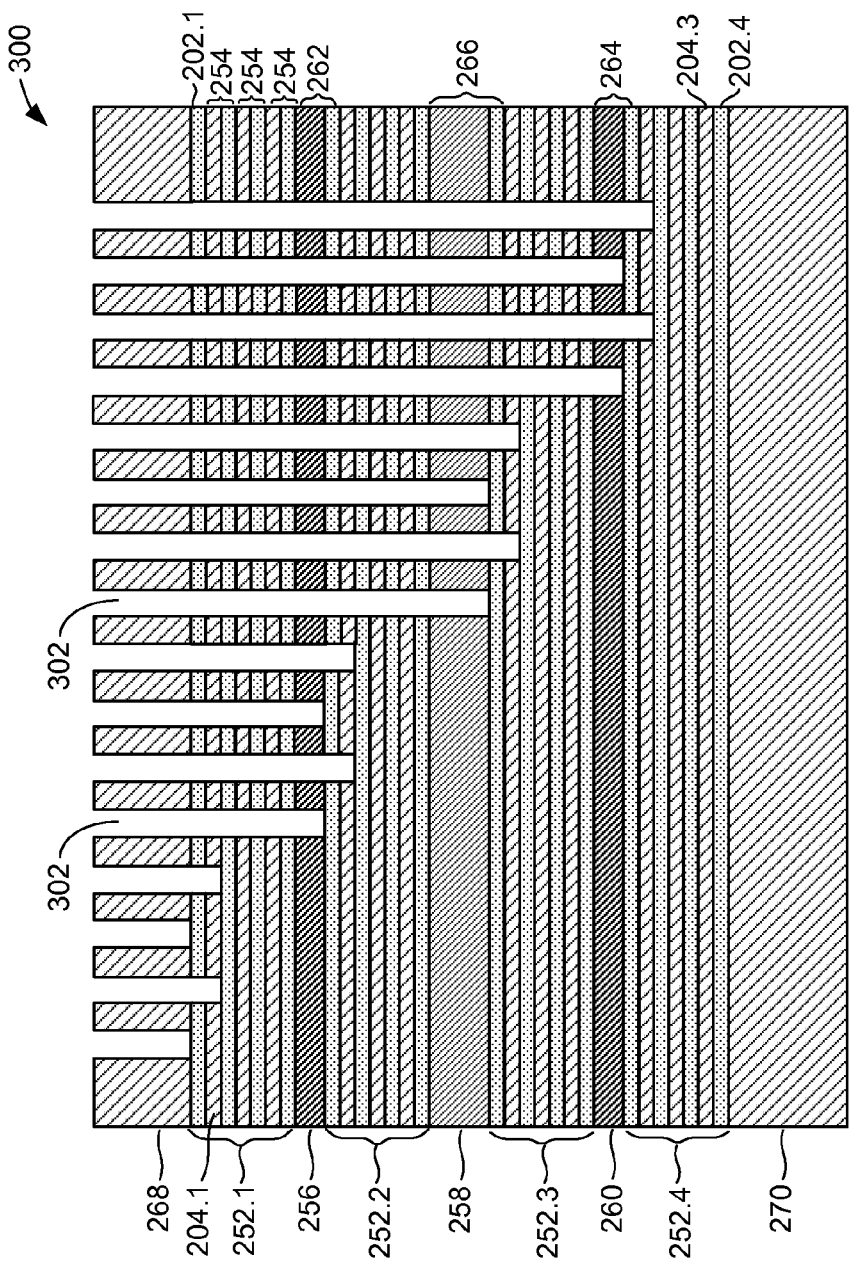
Figure 20:
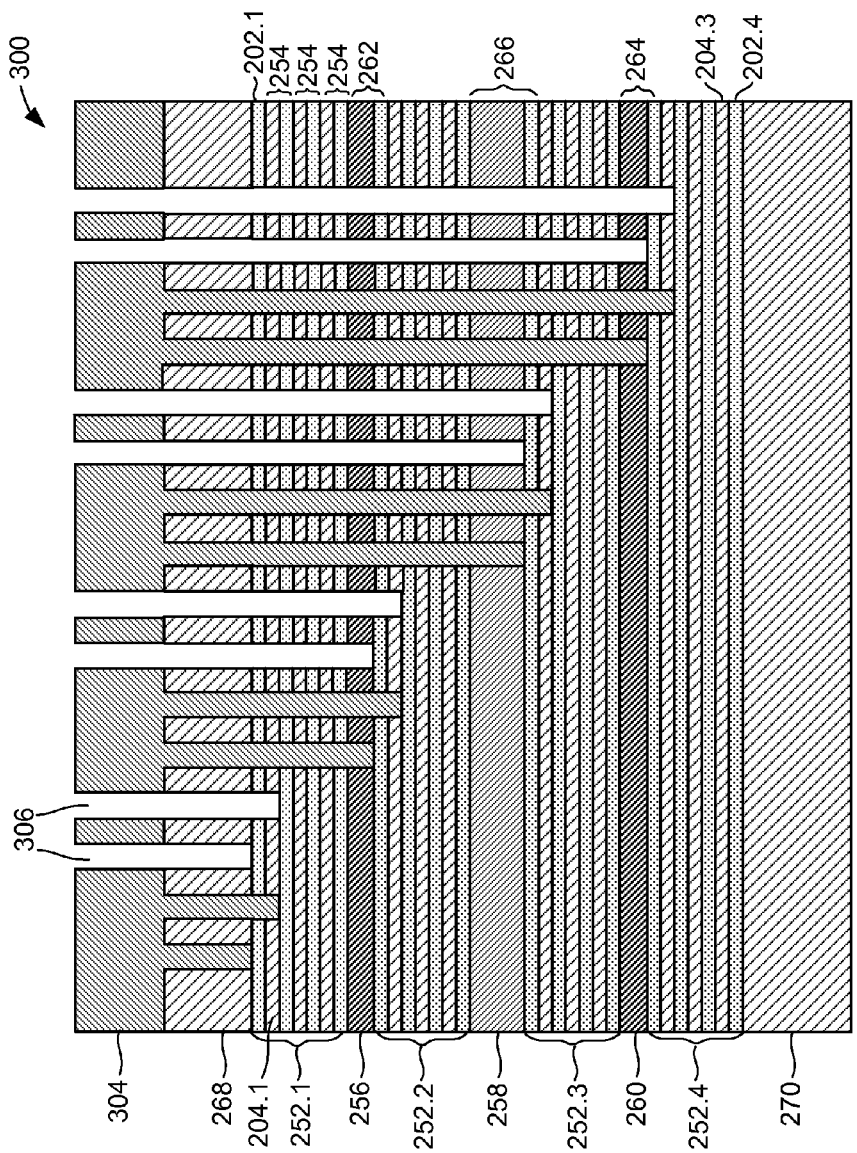
Figure 21:
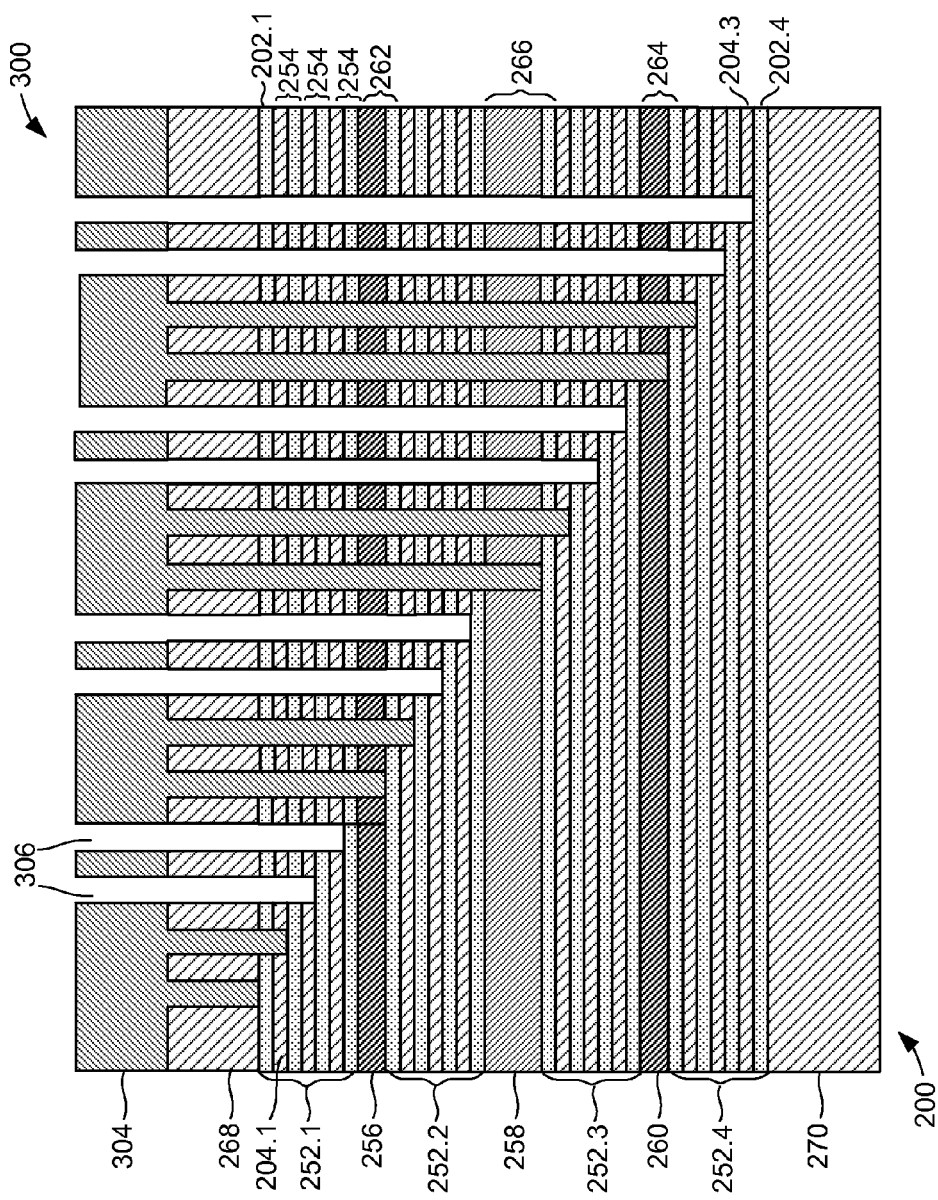

FIG. 17 shows the structure of FIG. 16 with a fourth etch mask 298 having openings 299 exposing every other first etched opening 282, second etched opening 288, third etched opening 294 and fourth etched opening 296. FIG. 18 shows a result of etching through the upper boundary active layer 202.1 and underlying insulation layer 204.1 for each of sub stacks 252.1, 252.2, 252.3 and 252.4. This creates a partially etched structure 300, shown with fourth etch mask 298 removed in FIG. 19. Partially etched structure 300 has openings 302 extending to different levels within stack 200. FIG. 20 shows the structure of FIG. 19 with a fifth etch mask 304 alternatingly covering and exposing two openings 302. Fifth etch mask 304 has openings 306 overlying the exposed openings 302 of FIG. 19. FIG. 21 shows a result of a second etching procedure in which two active layers 202 and two insulating layers 204 are etched through each opening 306.

Figure 22:
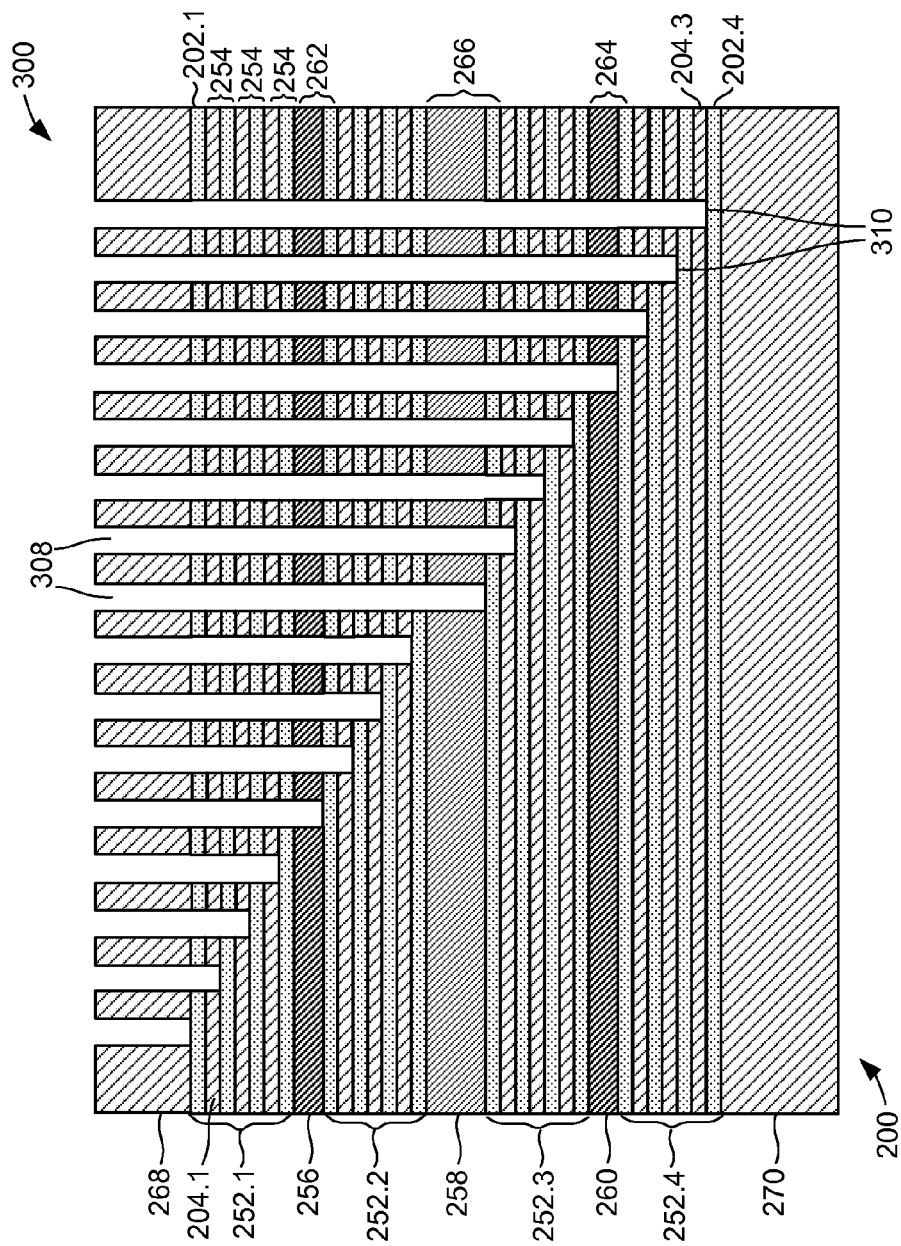
Figure 23:
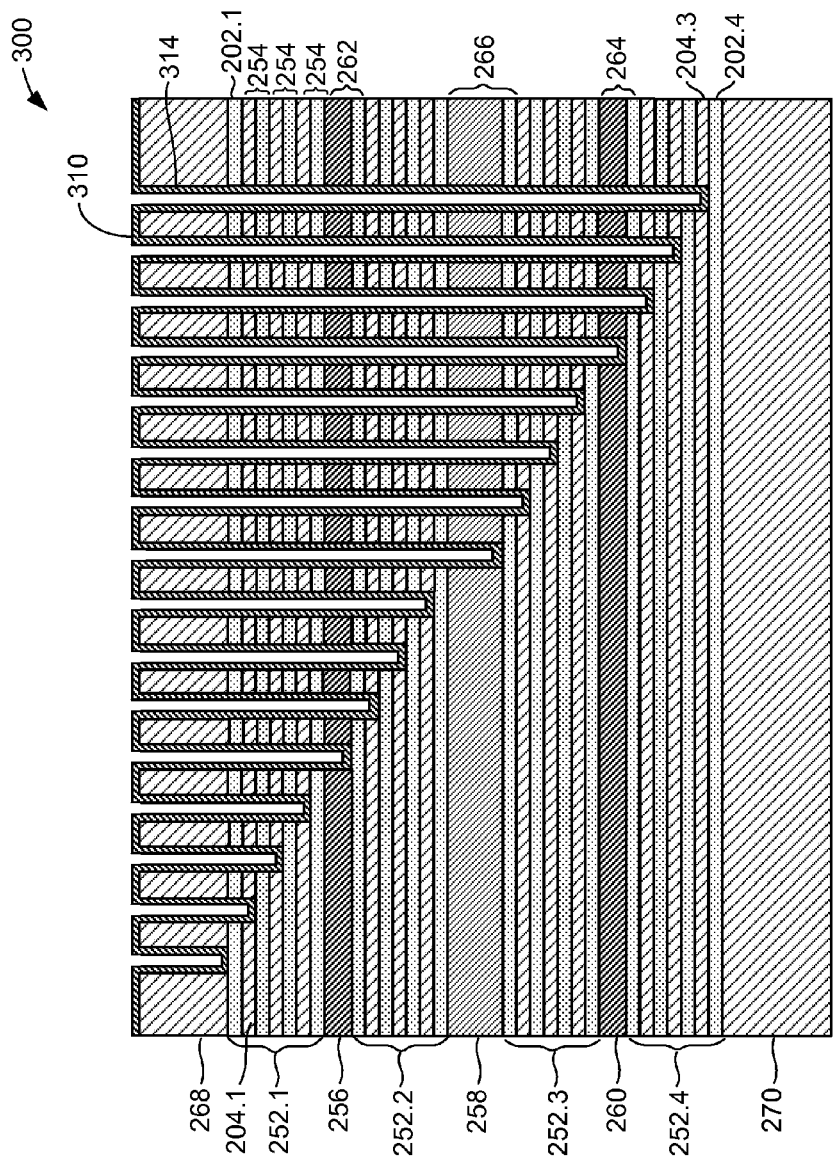
Figure 24:
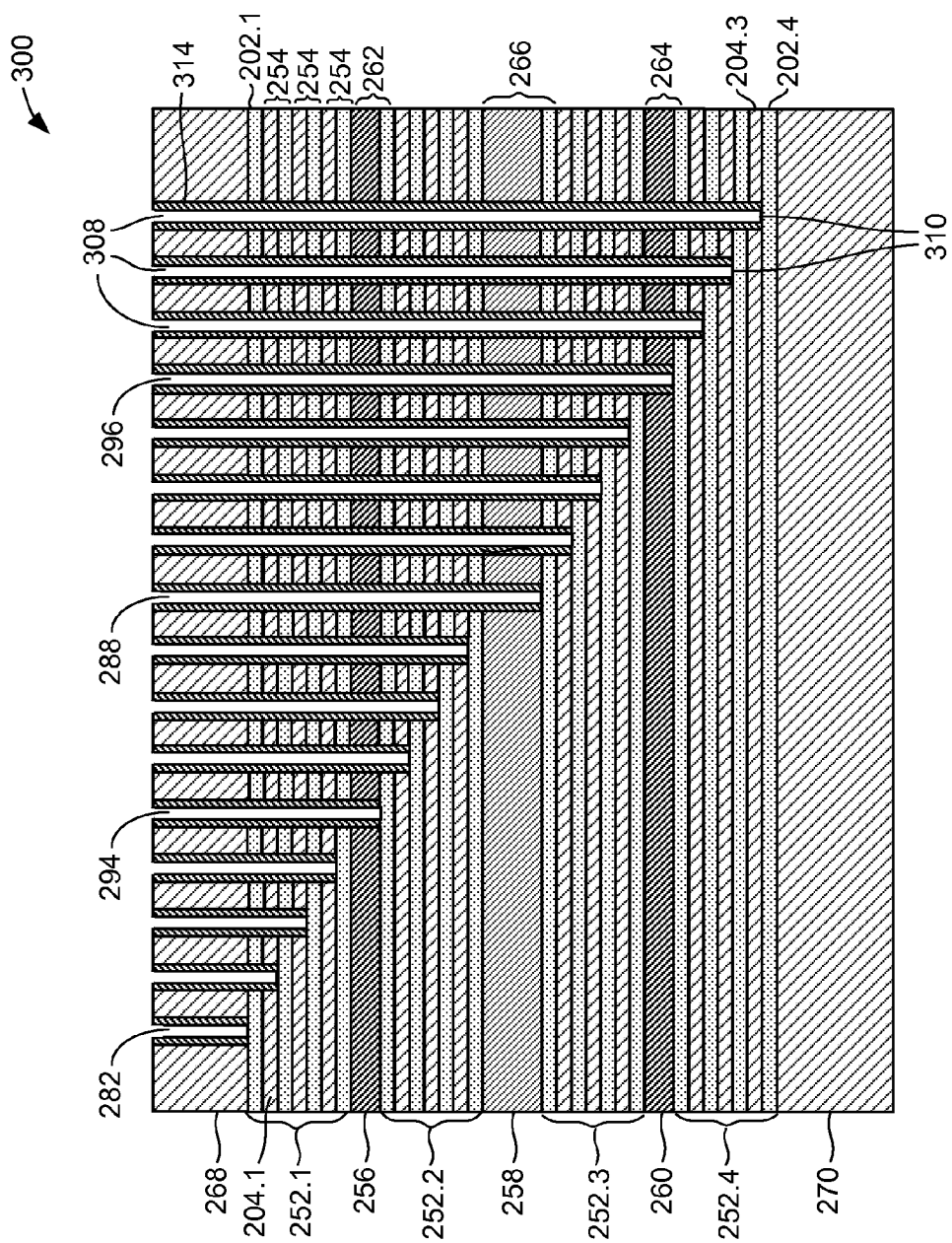
Figure 25:
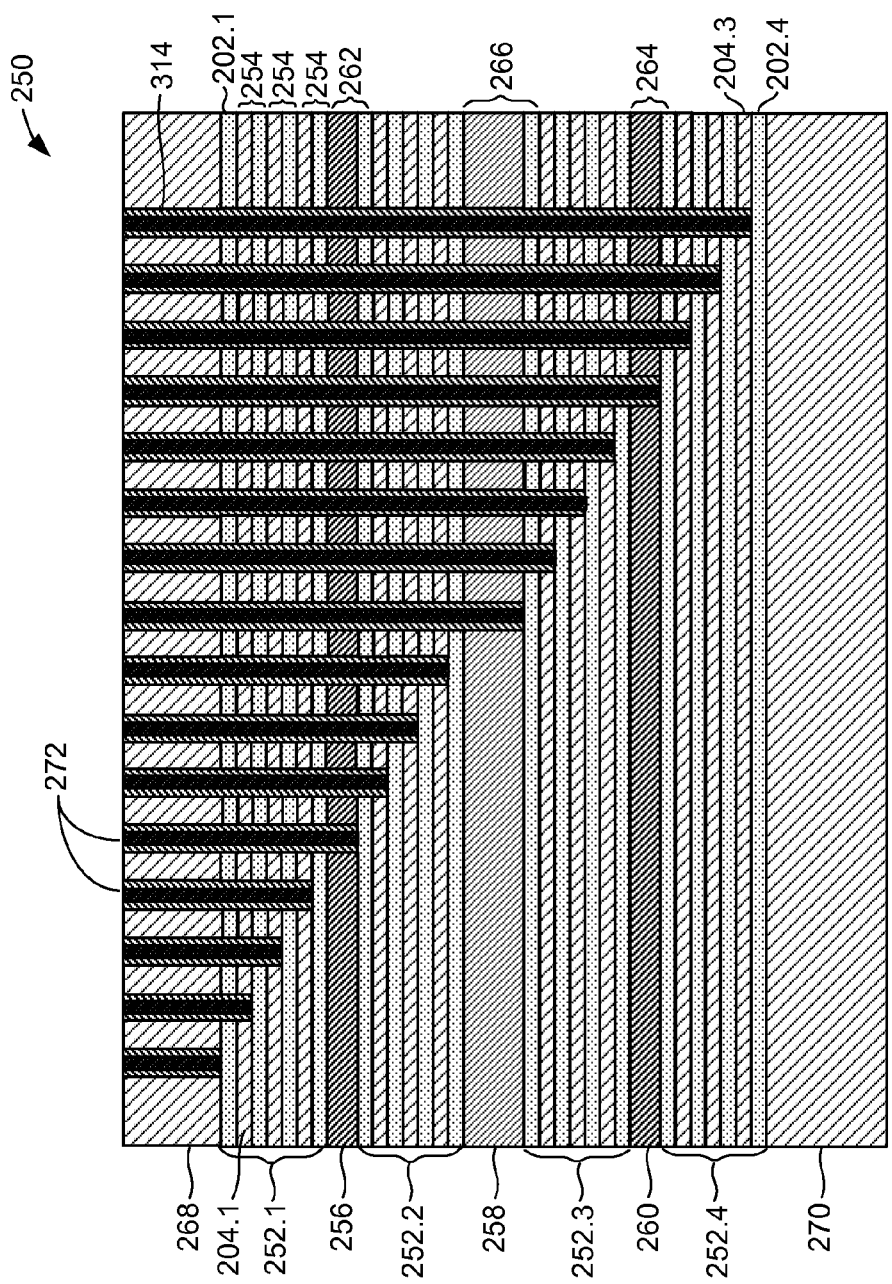

FIG. 22 shows the result of stripping off fifth etch mask 304 from the structure of FIG. 21 showing vias 308 extending down to landing areas 310 of active layers 202. The structure of FIG. 22 has a stairstep arrangement of landing areas 310. FIG. 23 shows an insulating layer 312, such as silicon nitride SiN, deposited over the structure of FIG. 22 thus creating a layer of sidewall insulation 314 lining each via 308. In FIG. 24, insulation layer 312 overlying upper insulating layer 268 and at the bottom of each via 308 has been removed to expose landing areas 310. FIG. 25 shows the structure of FIG. 24 after filling vias 308 with a conductor, such as tungsten W, to create interlayer conductors 272 extending from the upper surface 318 of the upper insulating layer 268 to landing areas 310 at each active layer 202, thus creating the contact structure 250 of FIG. 6.

FIGS. 26-43 will be discussed showing one example of steps for making a contact structure using a trim-etch process, a simplified example of which is discussed above with regard to FIGS. 4A-4G.

Figure 26:
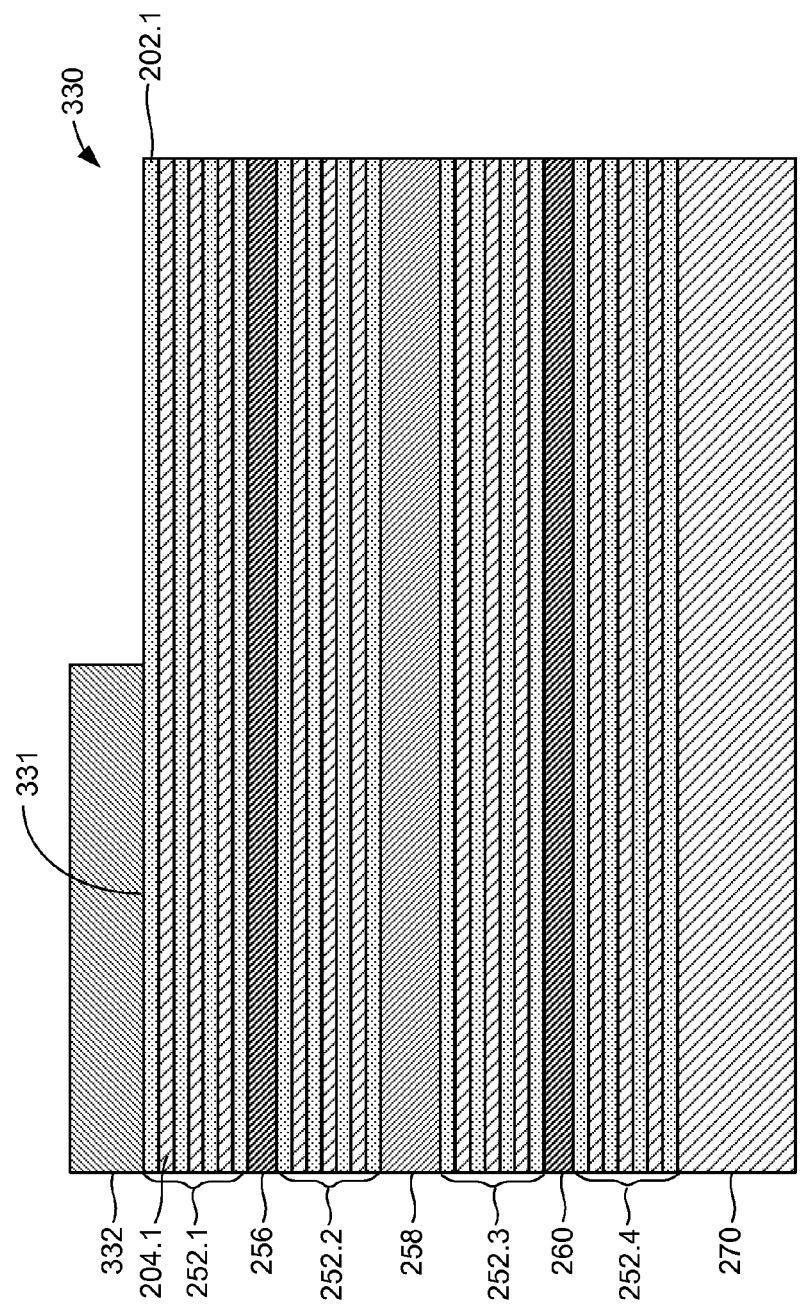
FIGS. 26-43 show an example of making a contact structure using a trim-etch process.

FIG. 26 illustrates a stack 330 identical to stack 200 of FIG. 7 except for the absence of upper insulating layer 268. A first etch mask 332 is formed over stack 330 covering a portion 331 of active layer 202.1 of first substrate 252.1 and exposing about half of the active layer. During the first etching step, the result of which is shown in FIG. 27, stack 330 is etched at the exposed portion of active layer 202.1 through half of the sub stacks, that is through first sub stack 252.1, sub stack insulating layer 256, second sub stack 252.2 and sub stack insulating layer 258, thereby exposing a portion 334 of upper boundary active layer 202.1 of third sub stack 252.3

Figure 27:
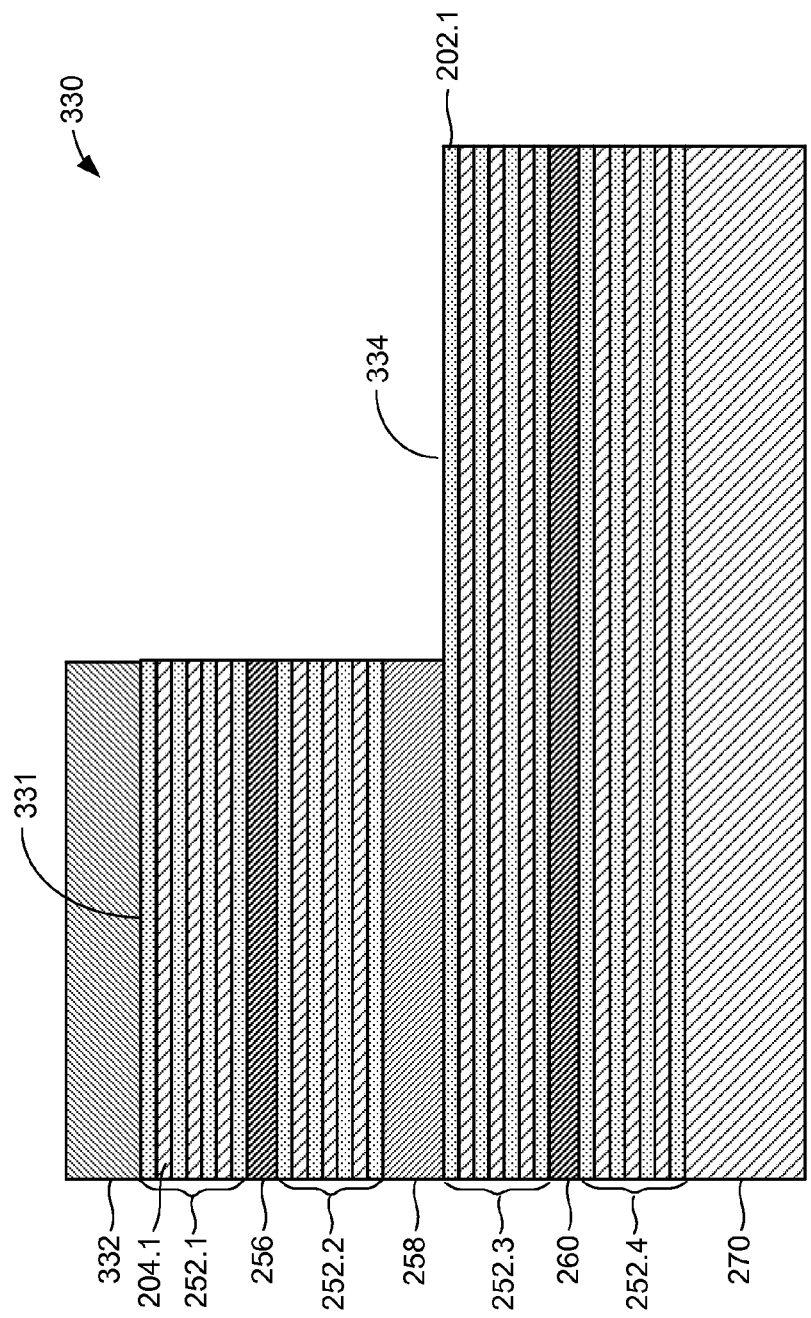
Figure 28:
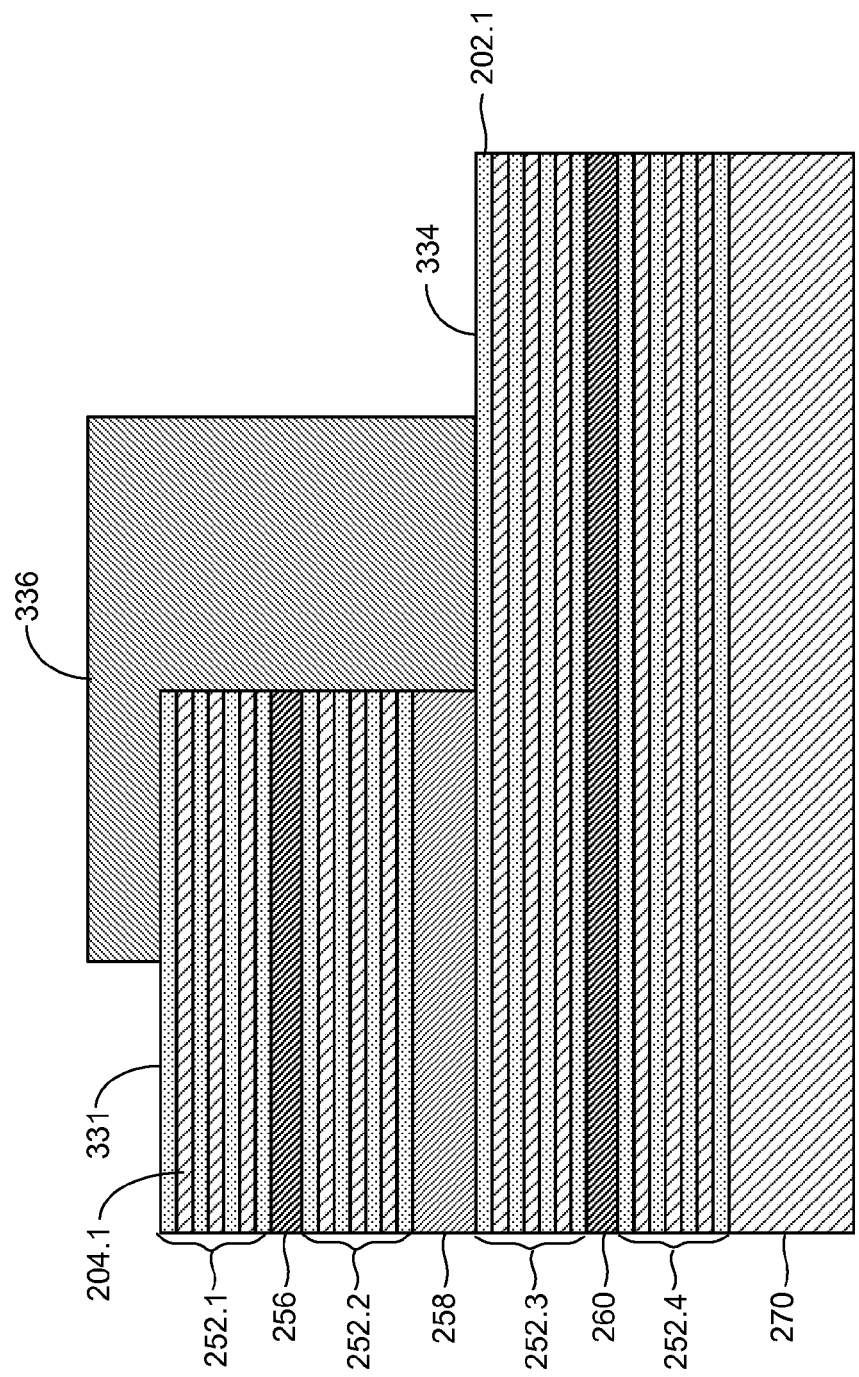
Figure 29:
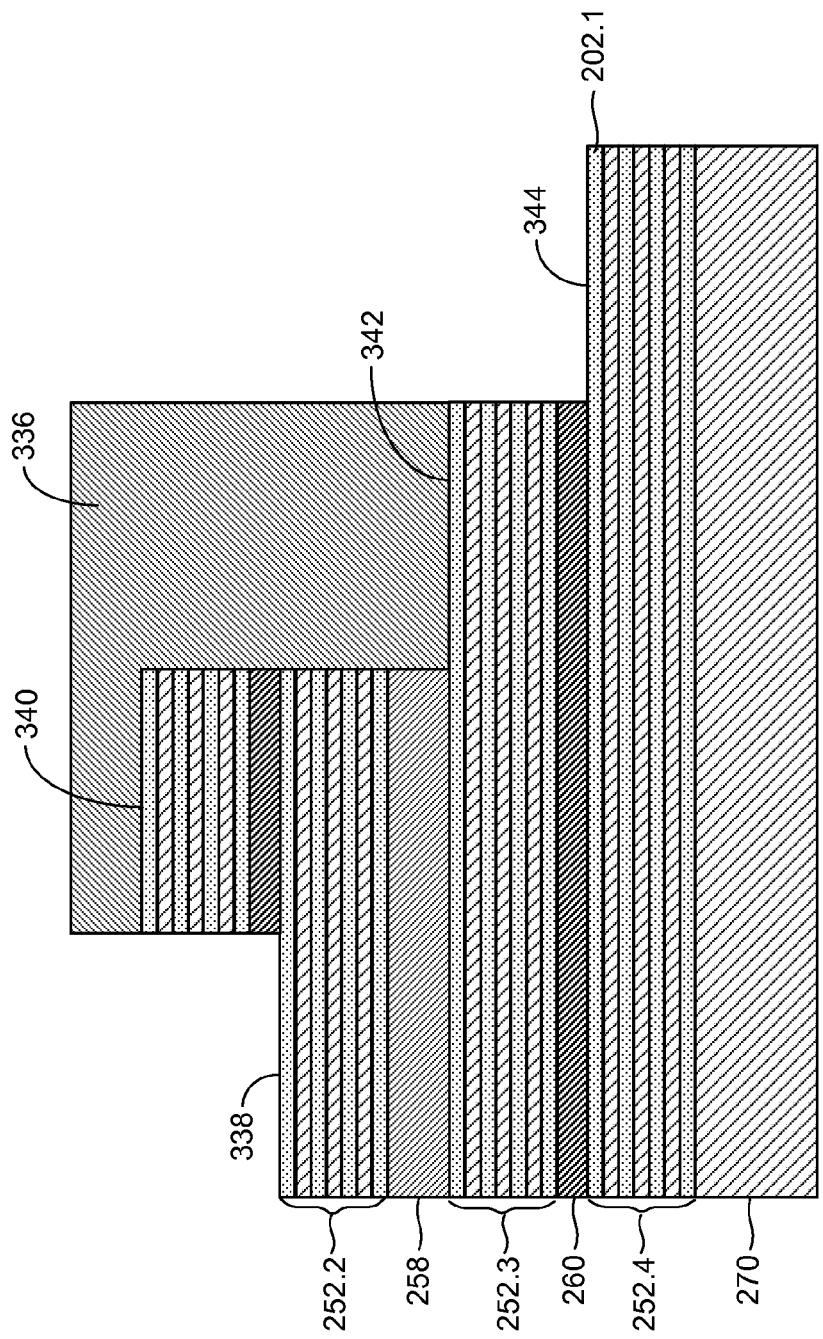
Figure 30:
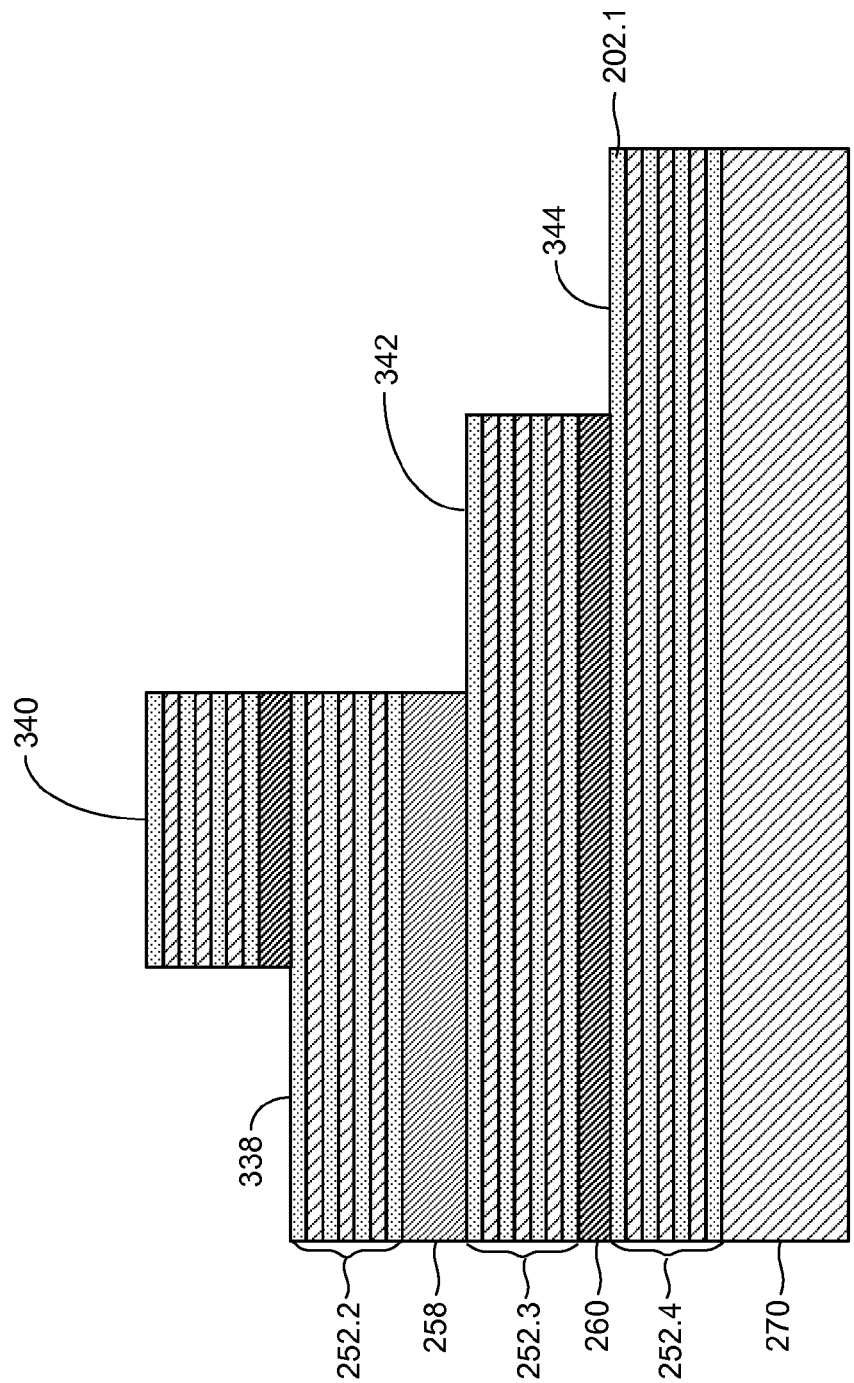

FIG. 28 shows the structure of FIG. 27 with a second etch mask 336 covering about one half of portion 331 and about one half of portion 334. The exposed region of portion 331 is then etched through sub stack 252.1 and sub stack insulating layer 256. The exposed region of portion 334 is etched through sub stack 252.3 and sub stack insulating layer 260. Doing so creates the structure of FIG. 29 with the surface areas 338, 340, 342 and 344. In FIG. 30, second etch mask 336 has been removed from the structure of FIG. 29.

Figure 31:
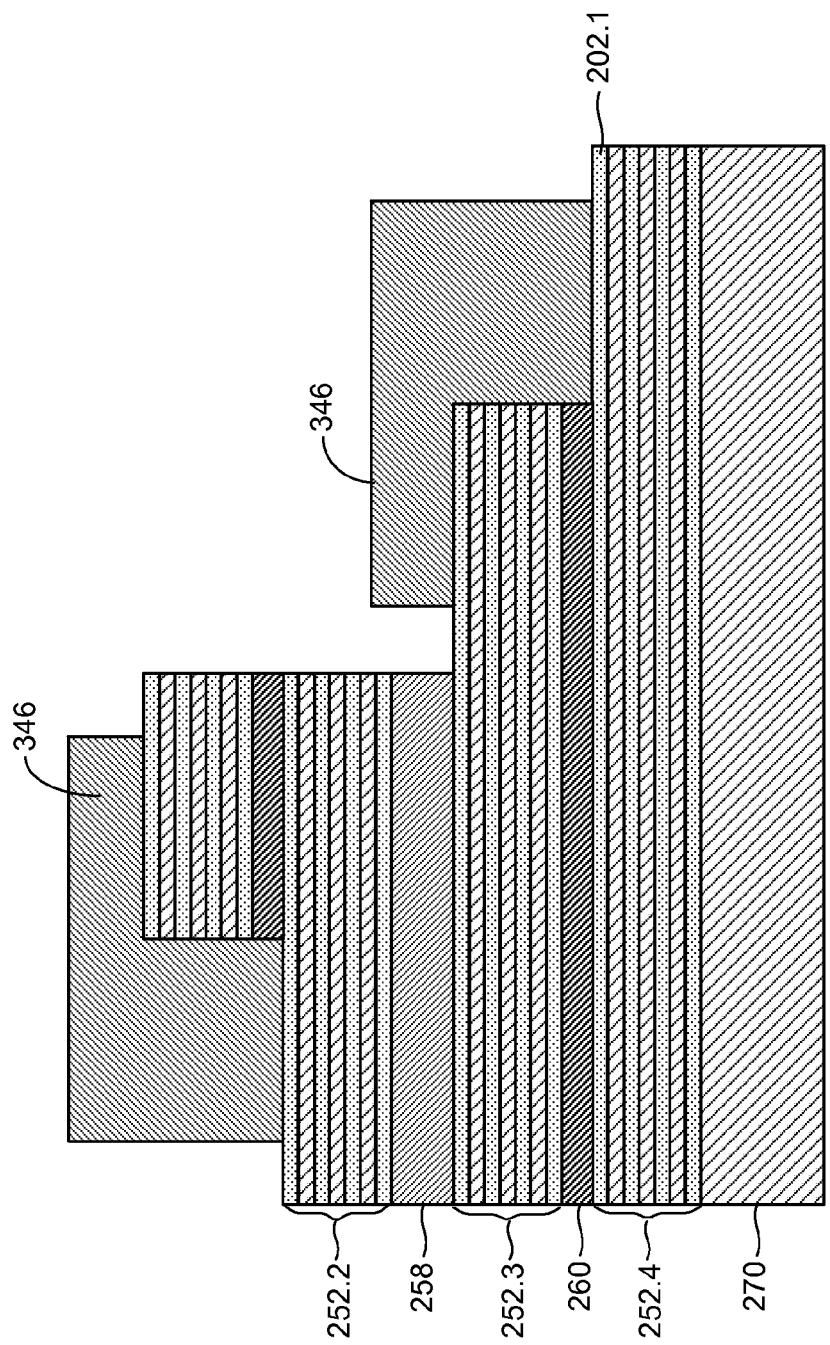
Figure 32:
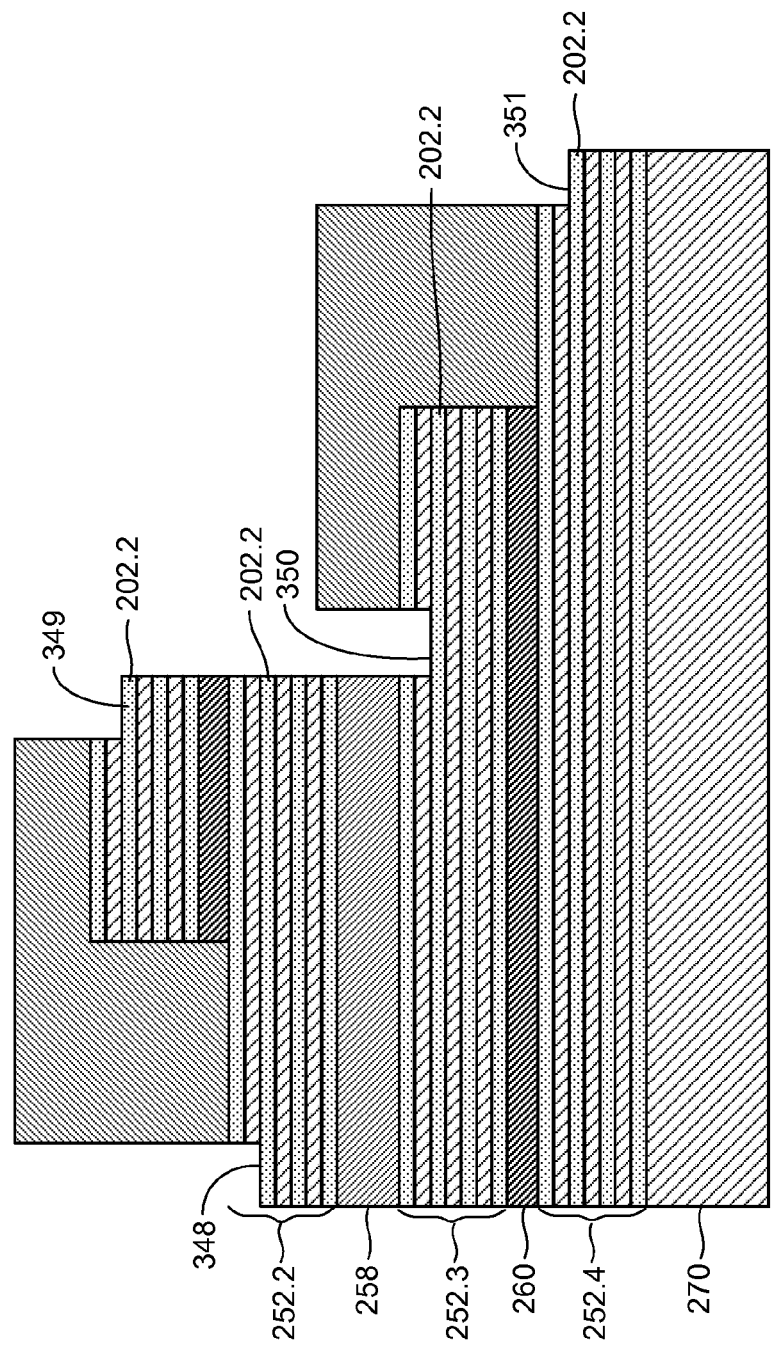
Figure 33:
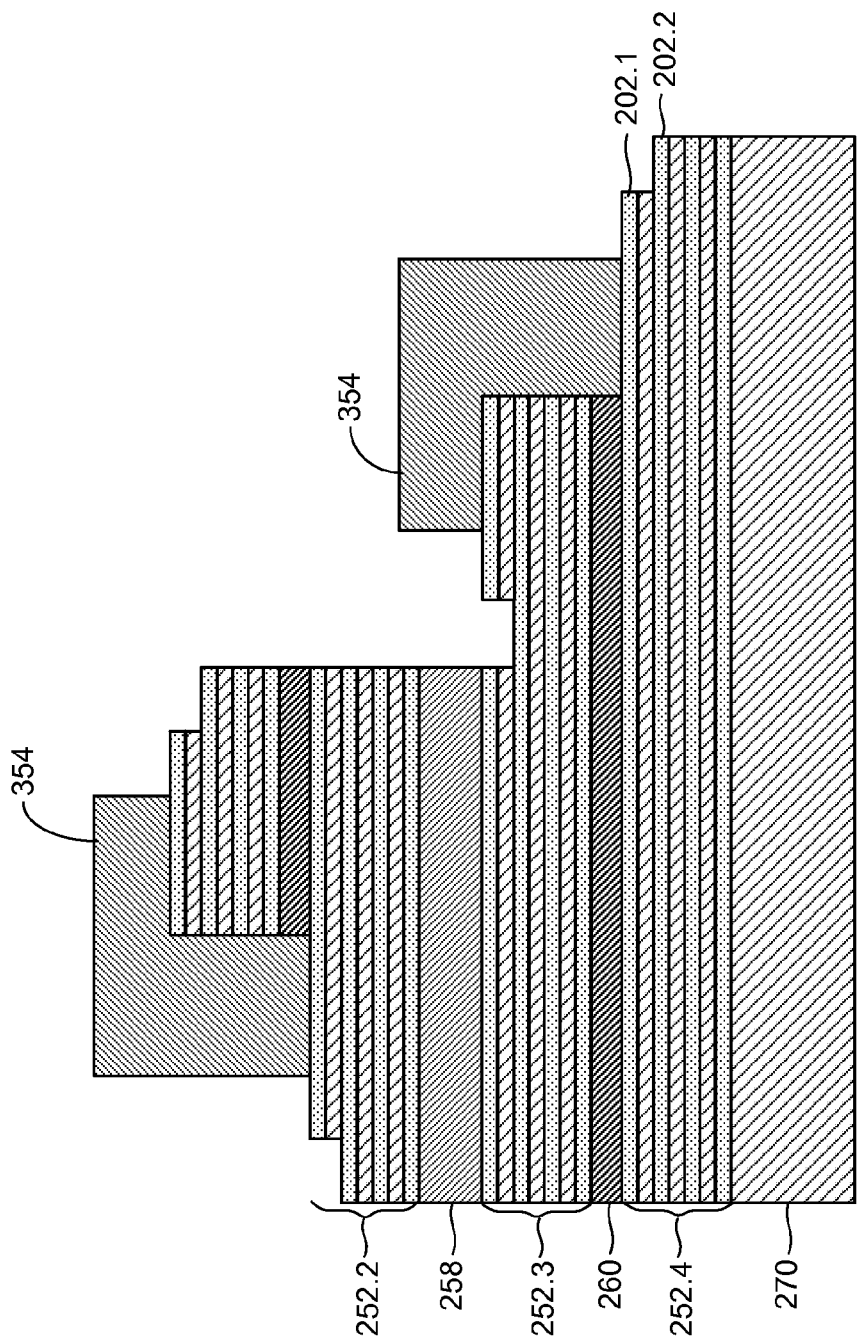
Figure 34:
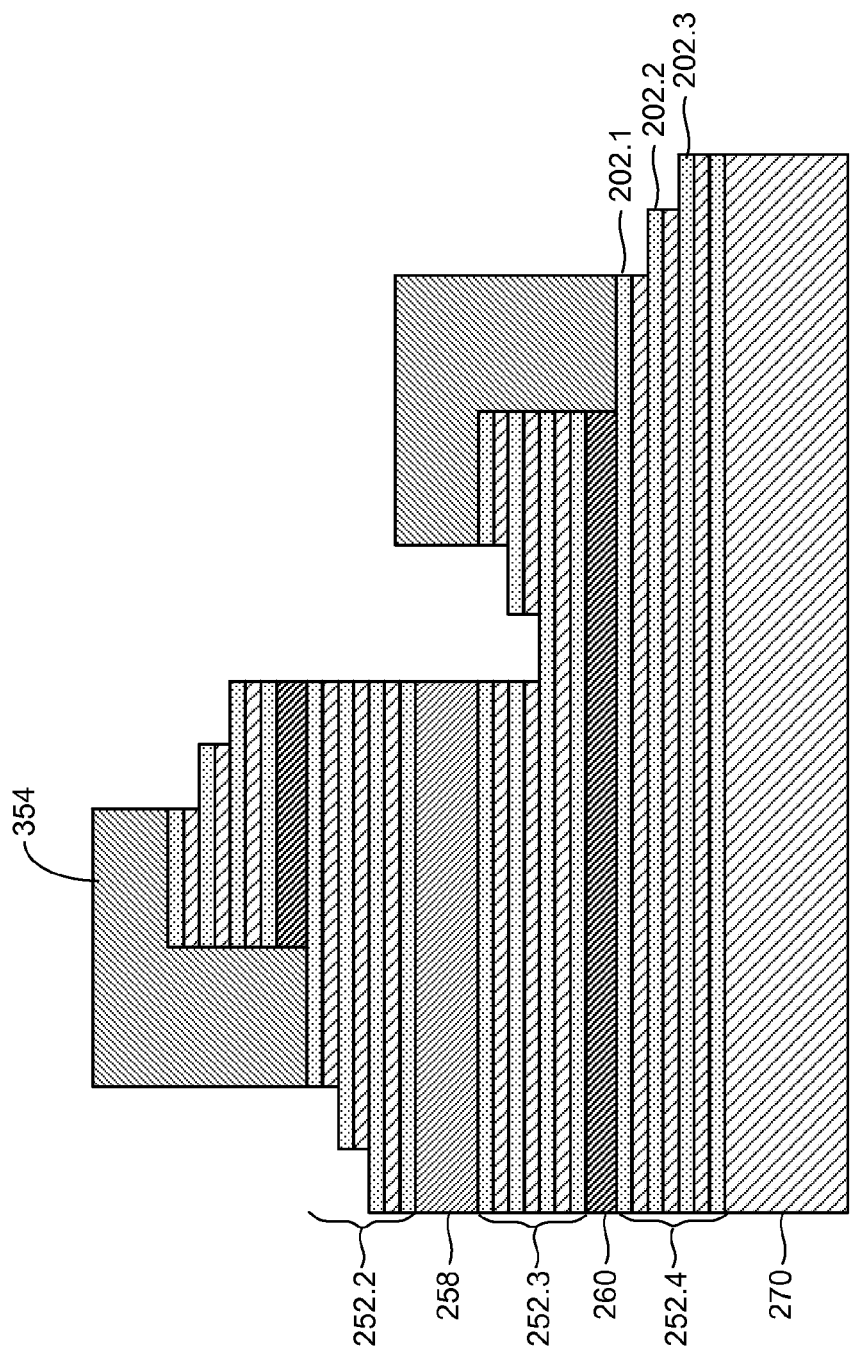
Figure 35:
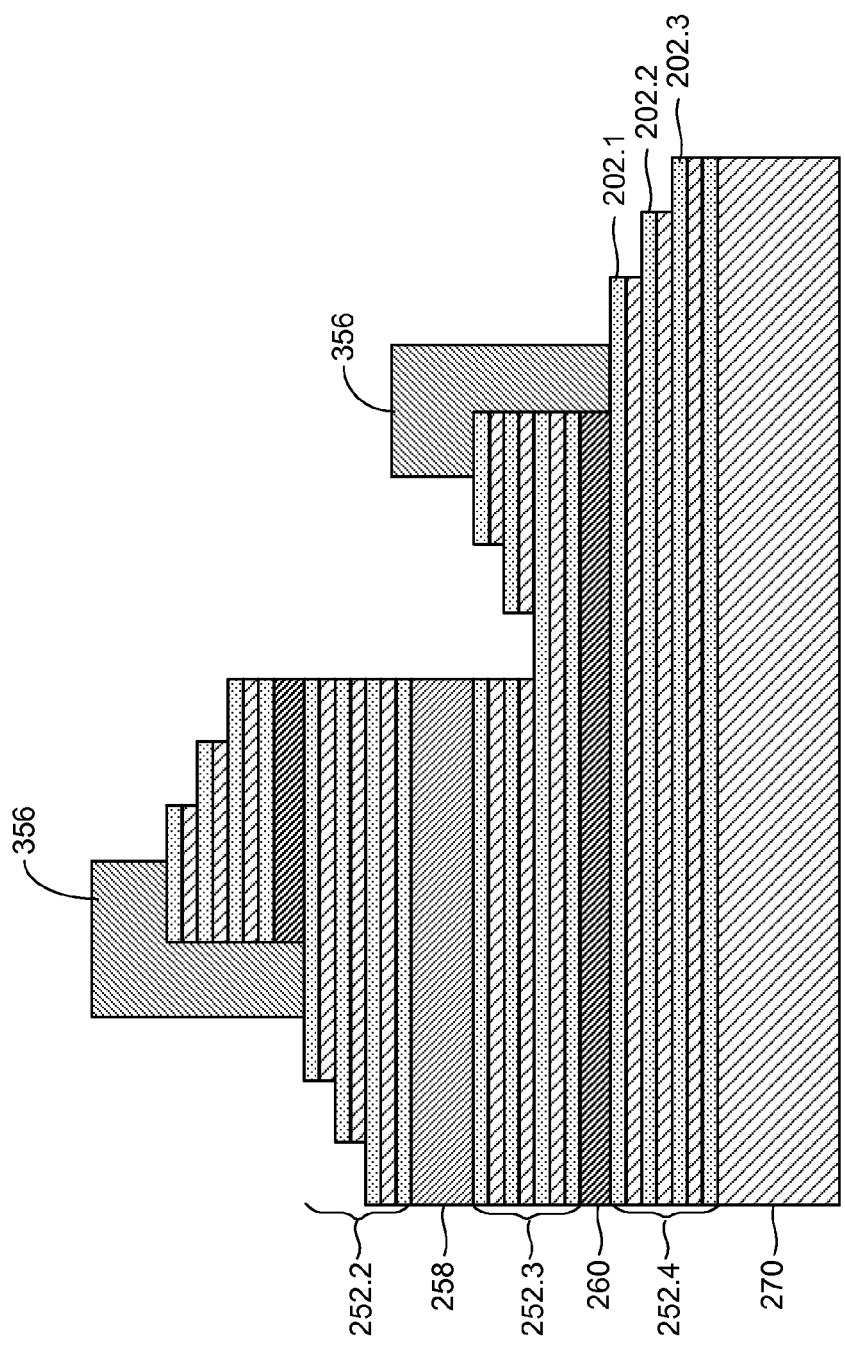

FIG. 31 shows a third etch mask 346 formed over surfaces 338-344 exposing a portion of each of those surfaces. Those exposed portions of surfaces 338-344 are etched through one active layer 202 and one insulating layer 204 to create the structure of FIG. 32 with exposed surface areas 348-351. Thereafter, as shown in FIG. 33, a third etch mask 352 is trimmed to create trimmed etch mask 354 which exposes the additional portions of upper boundary active layers 202.1 for each of sub stacks 252.1-252.4. This is followed by another etching step through one active layer 202 and the underlying insulating layer 204, the result of which is shown in FIG. 34. FIG. 35 shows the result of trimming trimmed etch mask 354 to create trimmed etch mask 356, again exposing additional portions of upper boundary active layers 202.1 for each of sub stacks 252.1-252.4. Again, this is followed by another etching step through one active layer 202 and the underlying insulating layer 204, the result of which is shown in FIG. 36.

Figure 36:
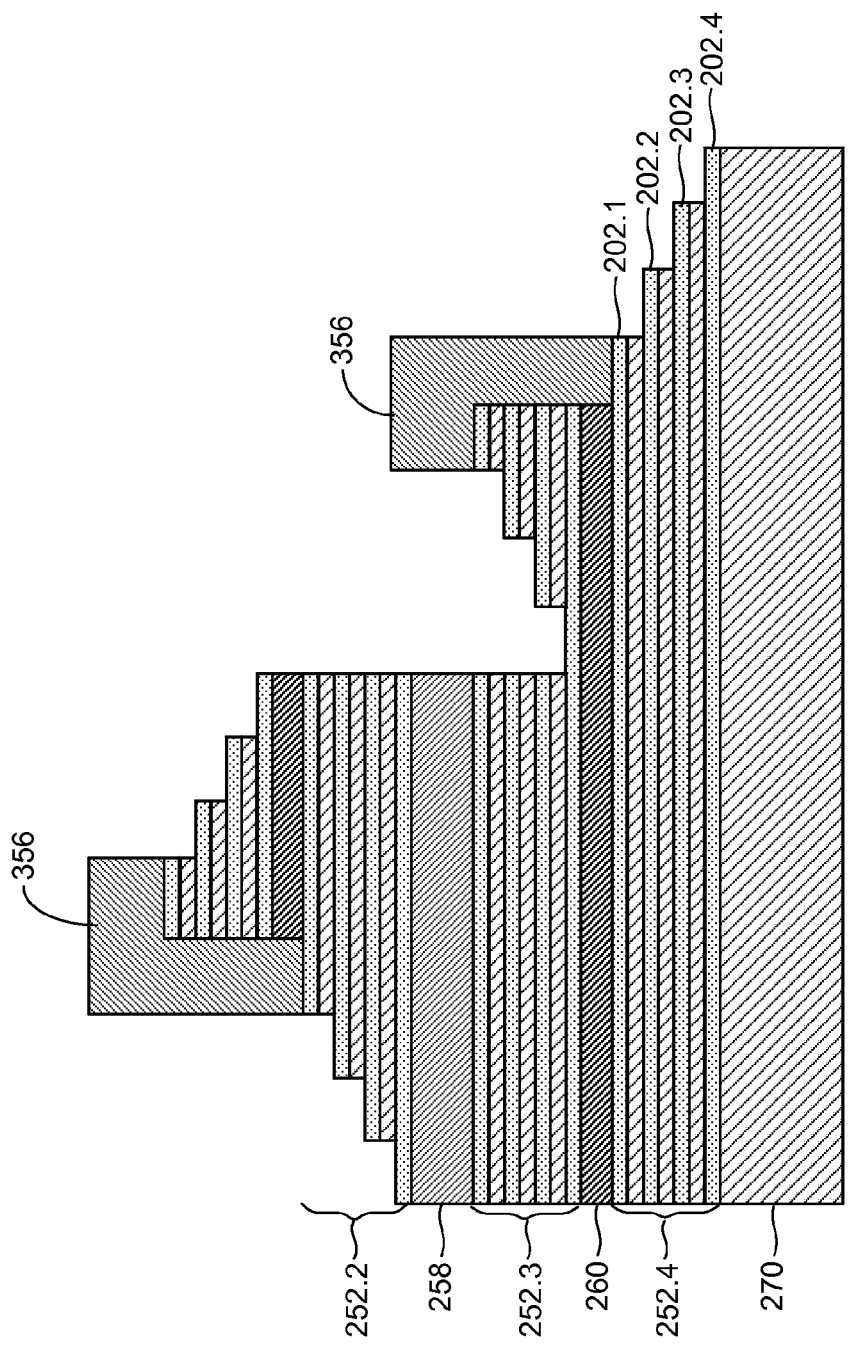
Figure 37:
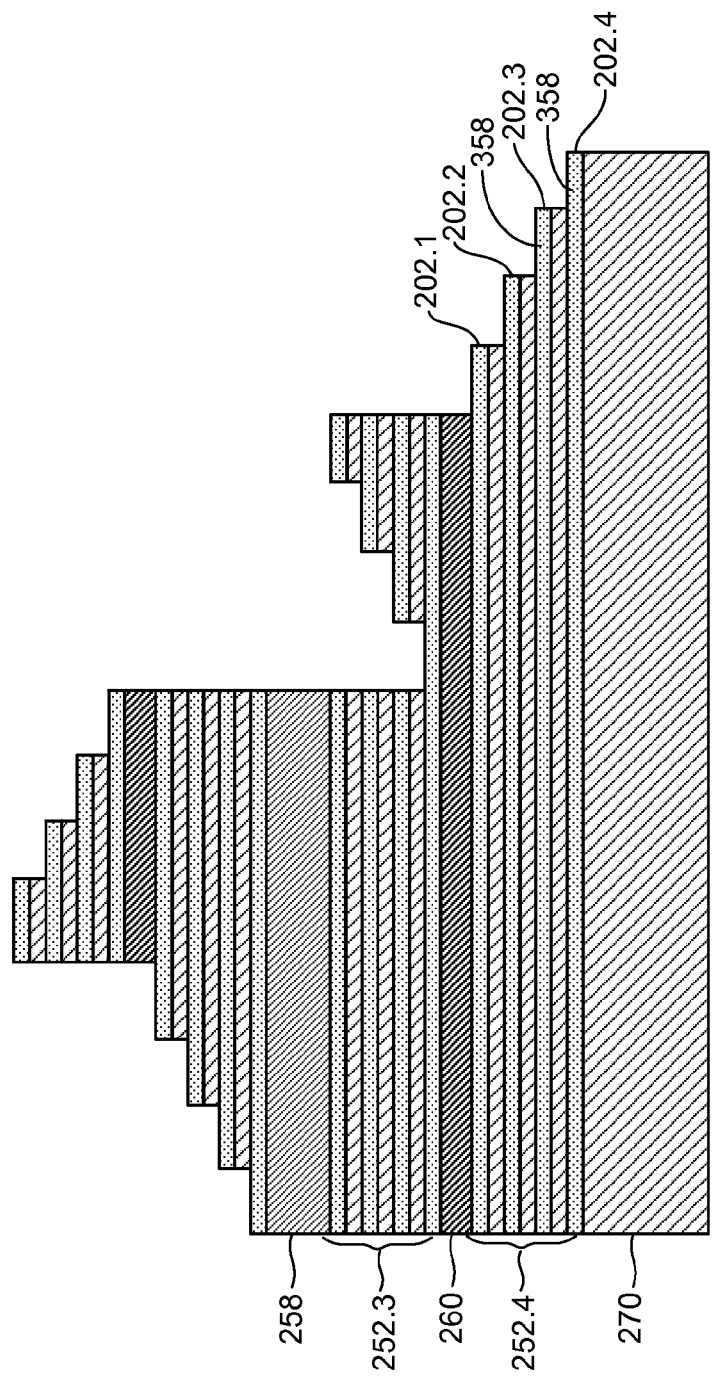
Figure 38:
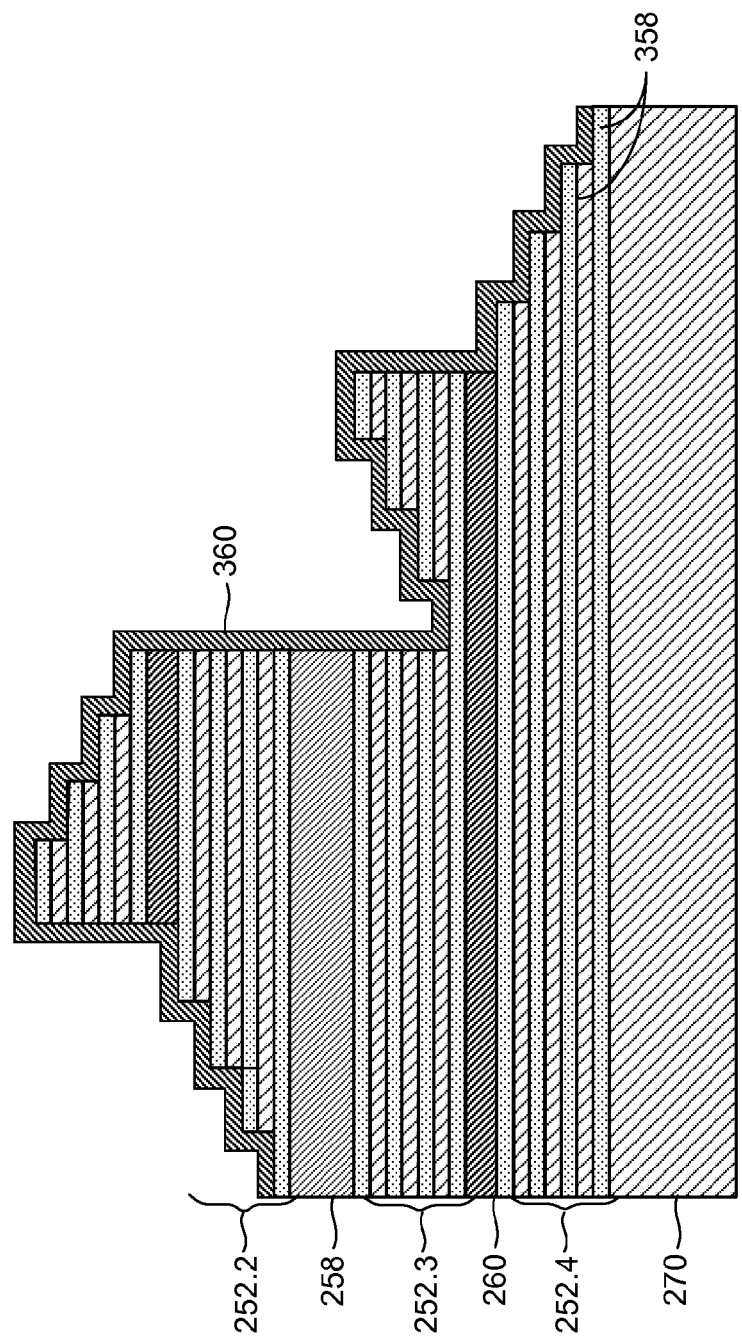
Figure 39:
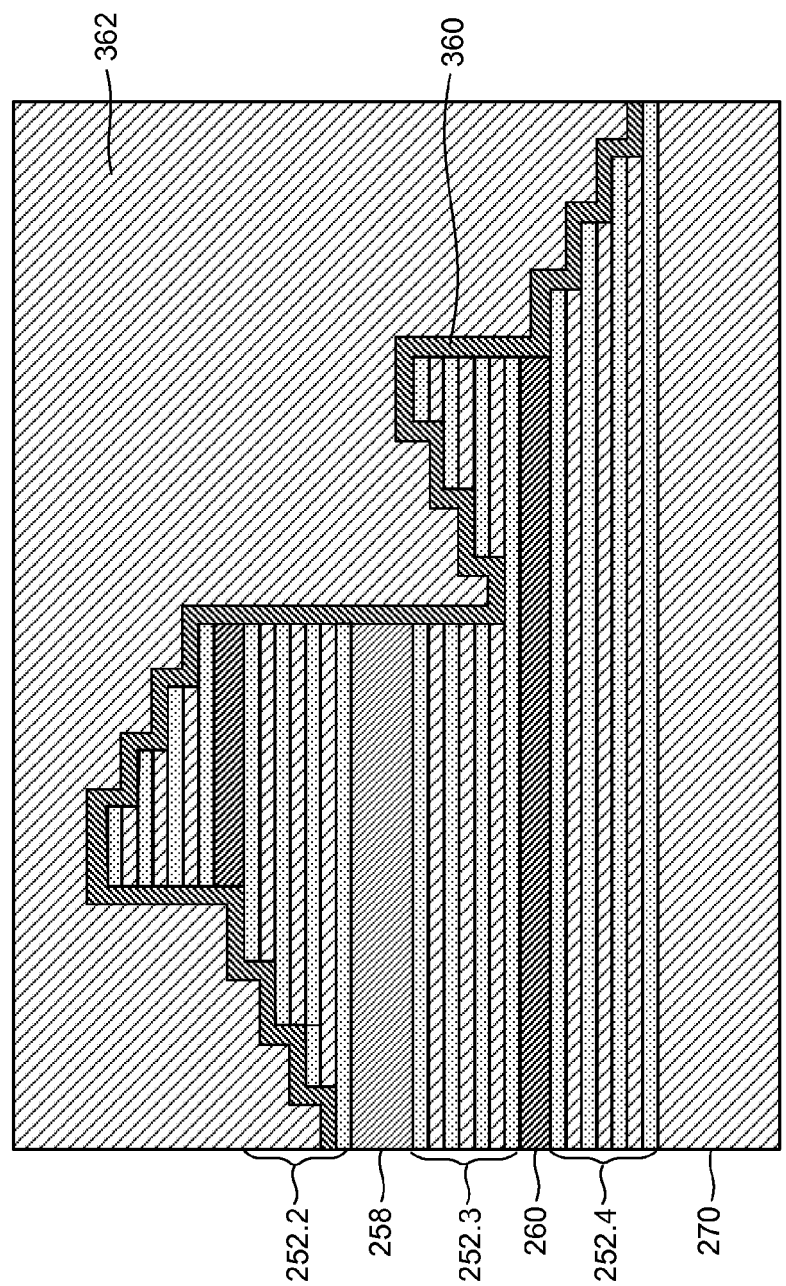
Figure 40:
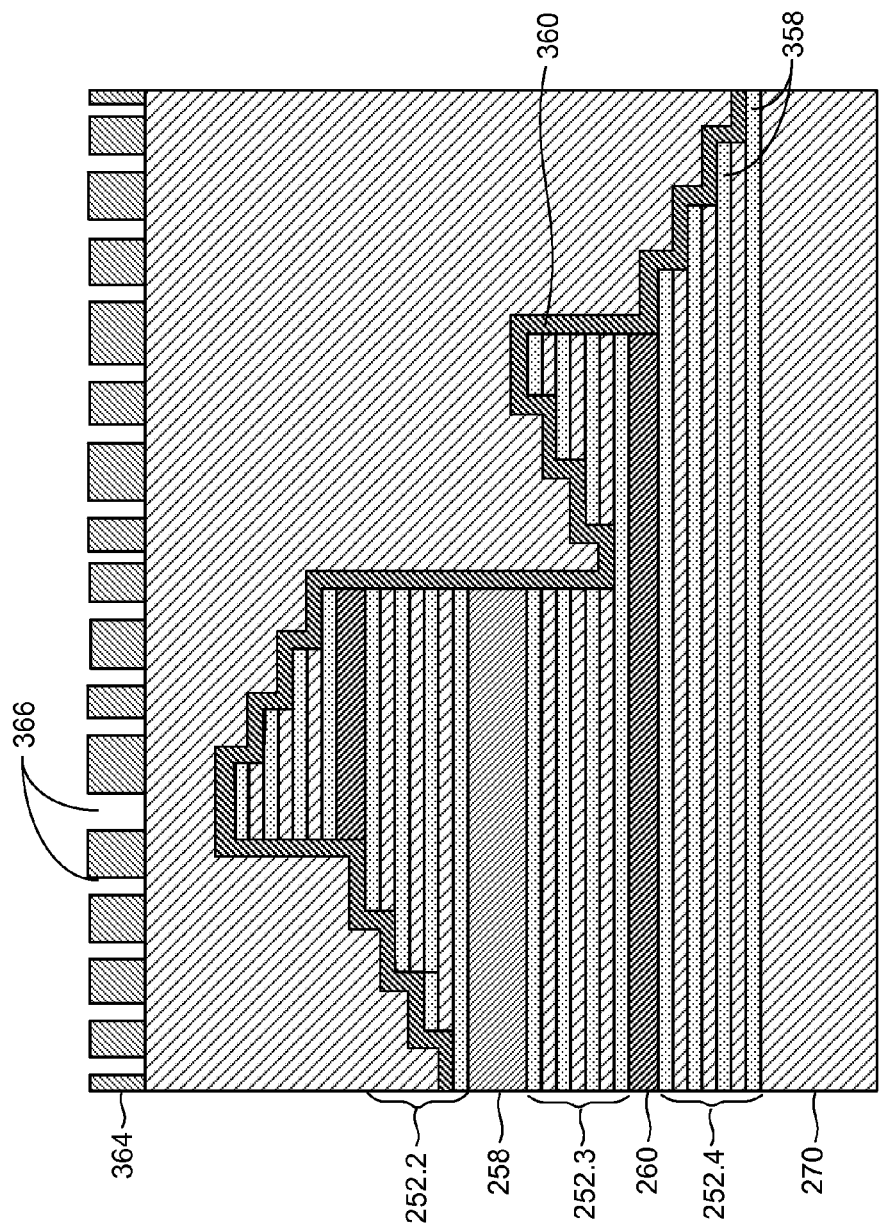
Figure 41:
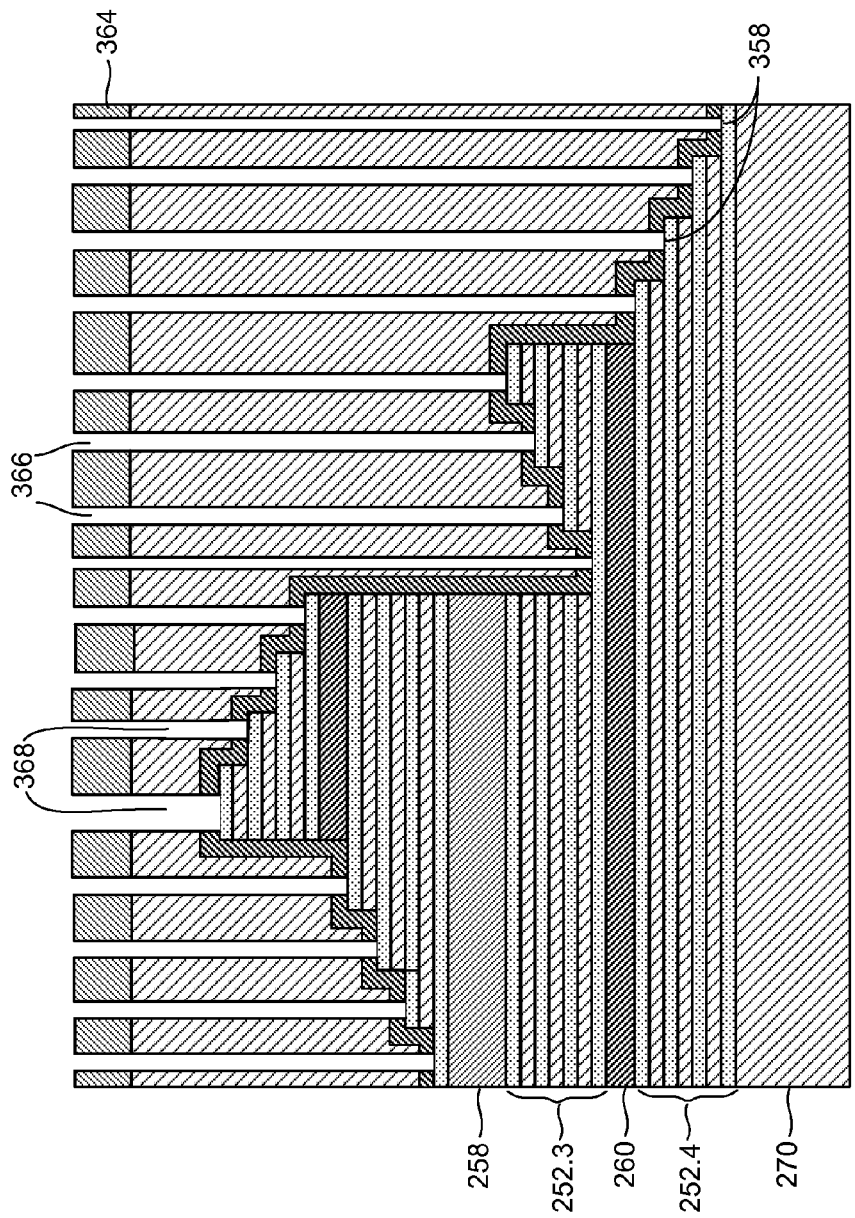
Figure 42:
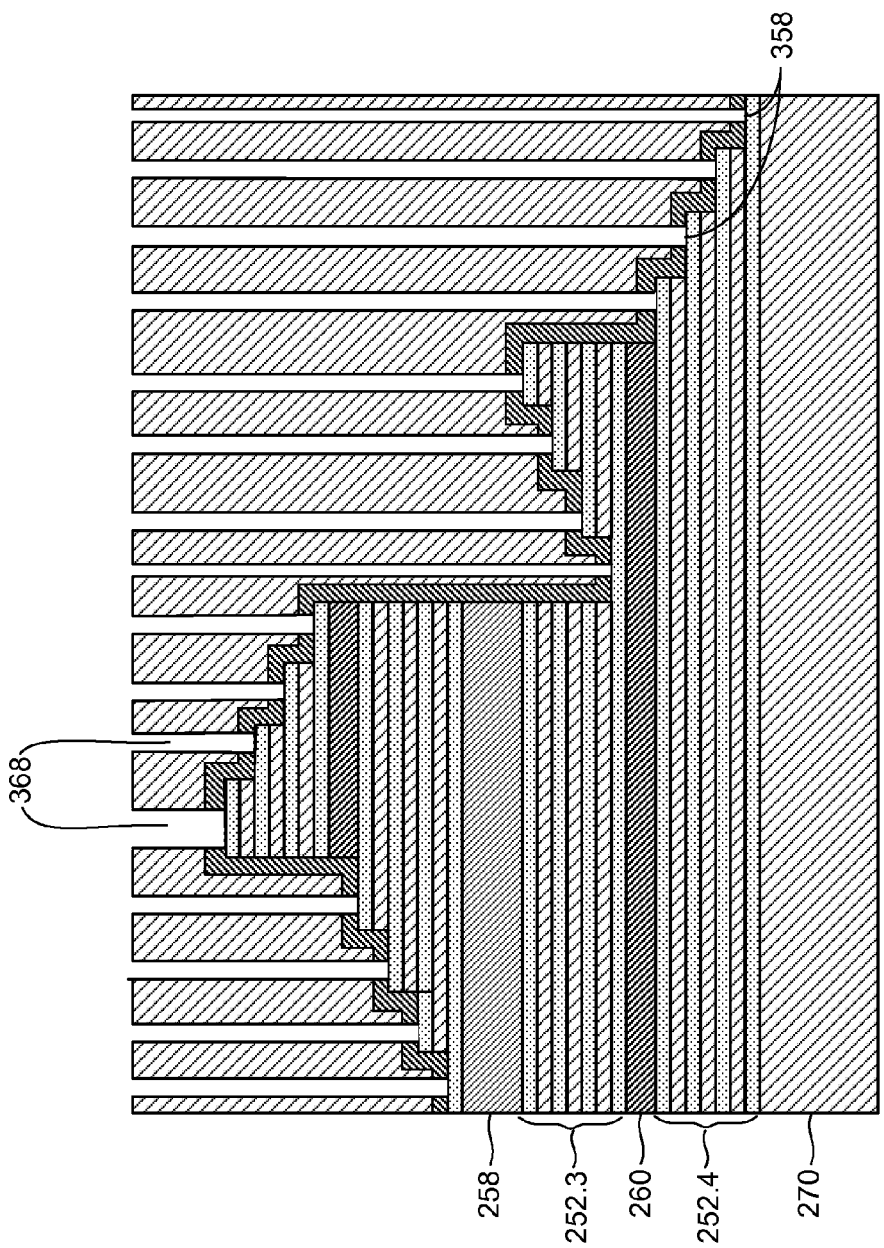
Figure 43:
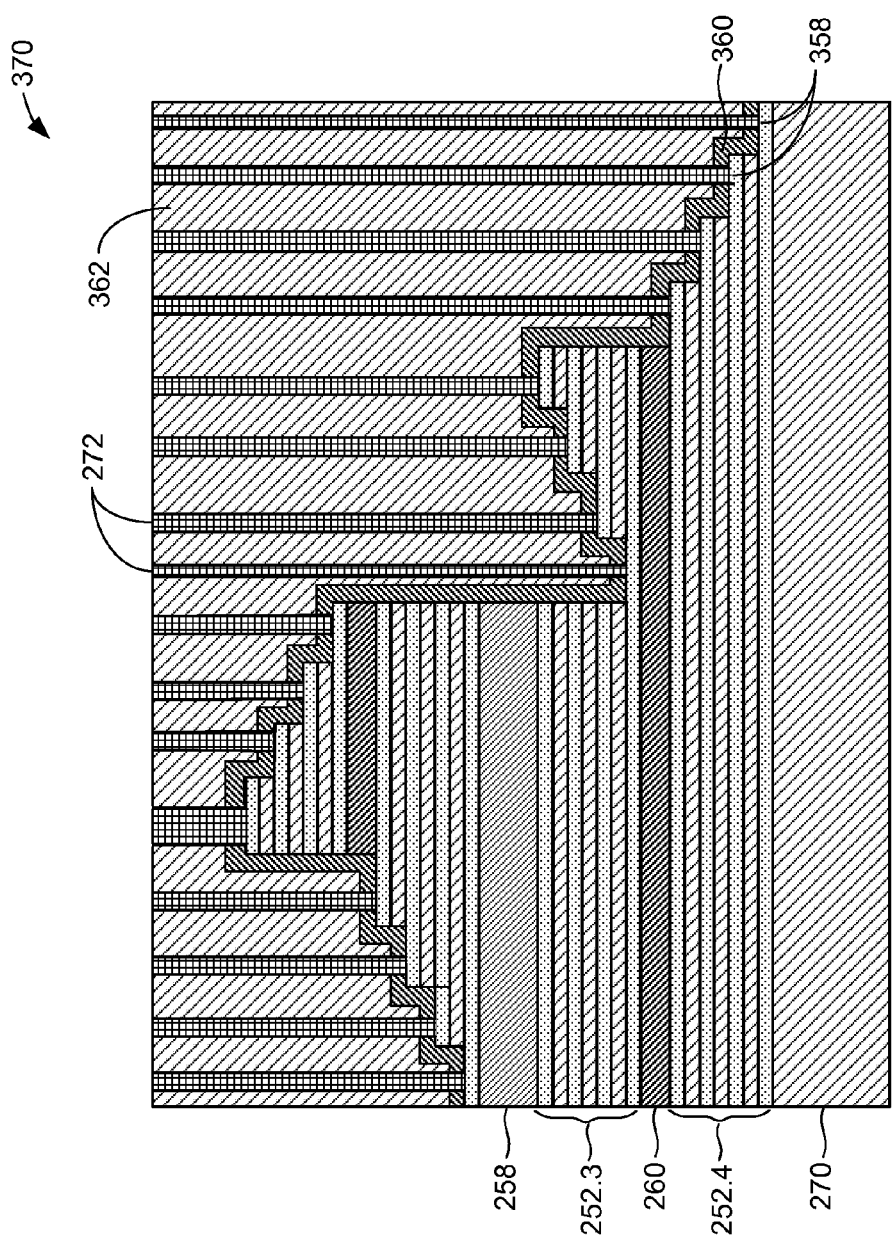

FIG. 37 shows the structure of FIG. 36 after removal of trimmed etch mask 356 resulting in a stairstep arrangement of landing areas 358. As shown in FIG. 38, this is followed by deposition of an insulating layer 360, sometimes referred to as stopping layer 360, which can be, for example, SiN. Next, as shown in FIG. 39, the structure of FIG. 38 is covered by an insulating material 362 made of, for example, SiO2. Next, a fourth etch mask 364 having openings 366 aligned with landing areas 358 is formed on insulating material 362. Vias 368 are formed through insulating material 362 and insulating layer 360 down to landing areas 358. This is shown in FIG. 41. FIG. 42 shows the structure of FIG. 41 after removal of fourth etch mask 364. FIG. 43 shows interlayer conductors 272, which can be made of tungsten W, formed within vias 368 to create contact structure 370.

Figure 44:
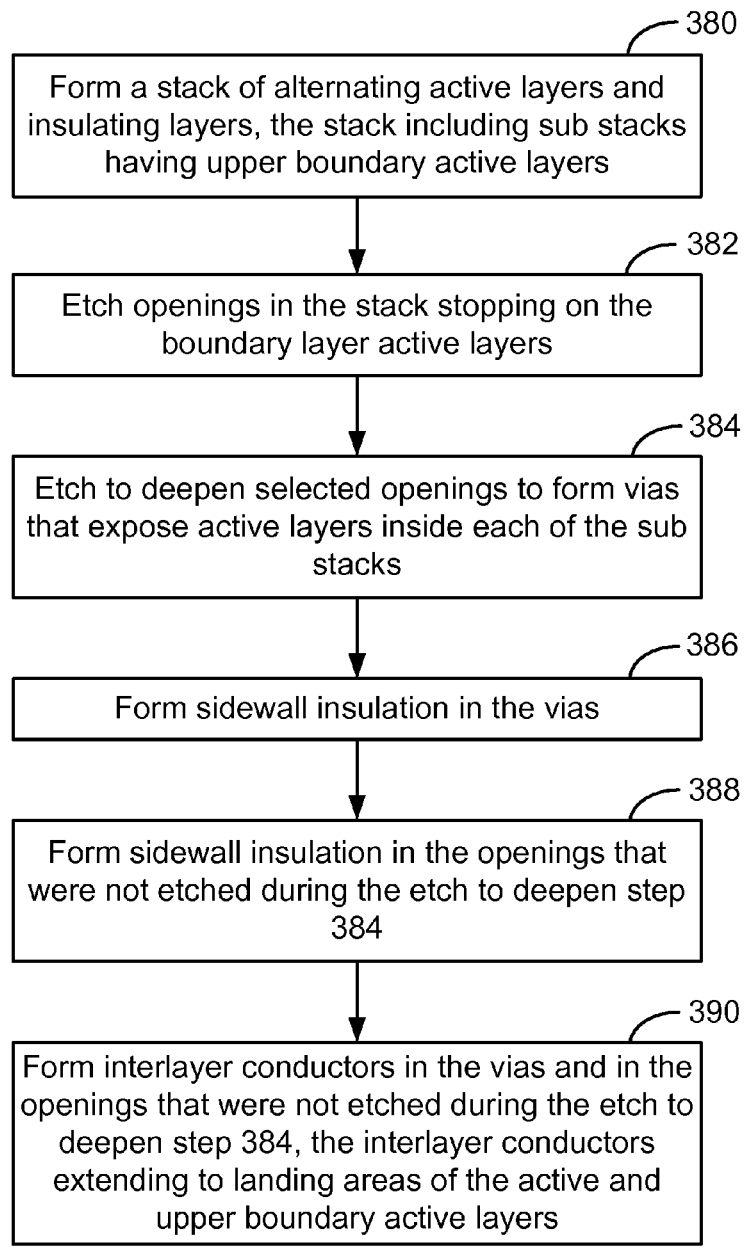
FIG. 44 is a simplified flowchart outlining the steps carrying out the method for forming a contact structure described below with regard to FIGS. 7-25.

FIG. 44 is a simplified flowchart outlining the basic steps for carrying out a method for forming a contact structure as described above with regard to FIGS. 7-25. At step 380 a stack 200 of alternating active and insulating layers 202 and 204 is formed. A plurality of openings 294, 288 and 296 are etched in the stack at step 382, the openings stopping on the boundary layer active layers 202.1. Selected ones of the openings 294, 288 and 296 are etched to deepen them at step 384 to create vias 308. At steps 386 and 388, insulation 314 is formed in the vias 308 and in the openings 294, 288 and 296 that were not etched. This is followed by the formation of interlayer conductors 272 therein at step 390. Interlayer conductors 272 connect to landing areas 310 of the active areas 202.

Figure 45:
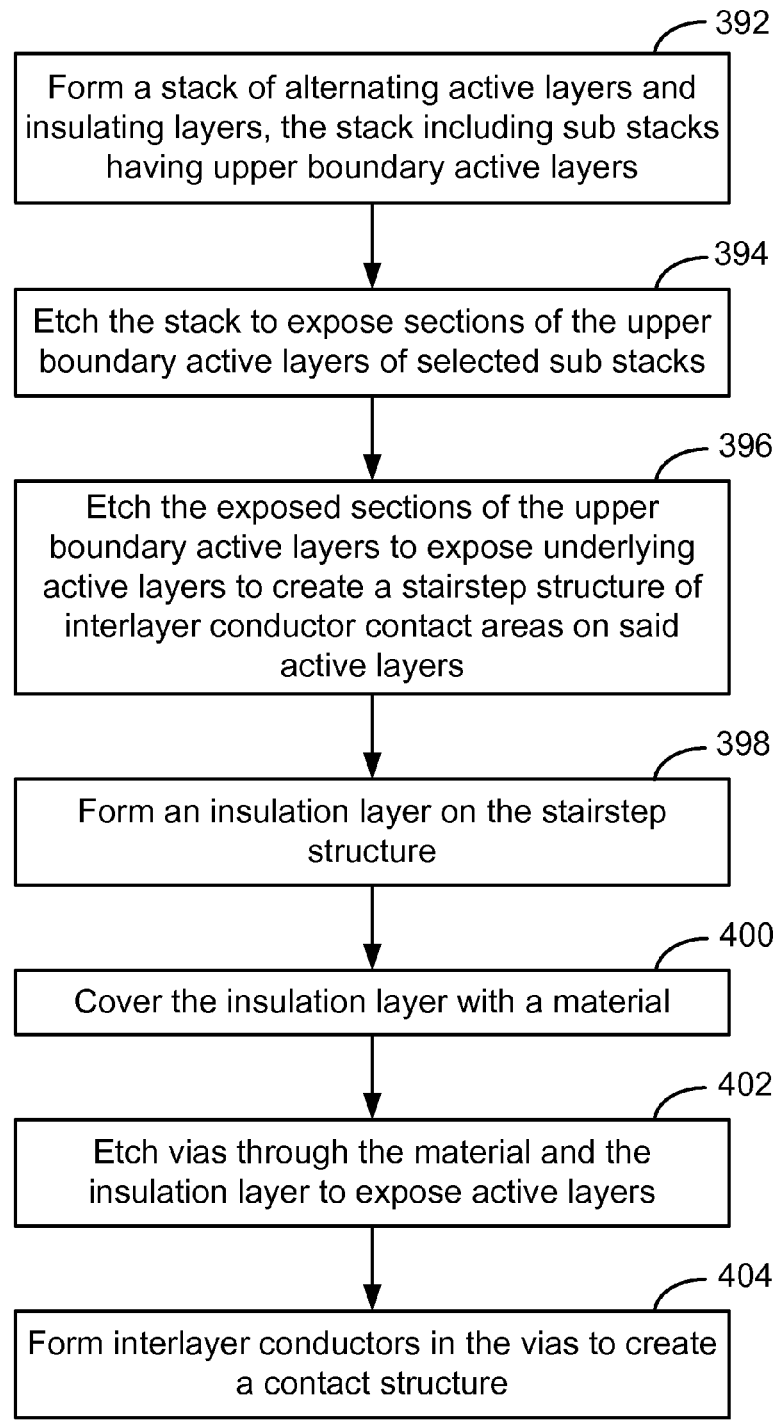
FIG. 45 is a simplified flowchart outlining the steps carrying out the method for forming a contact structure described below with regard to FIGS. 26-43.

FIG. 45 is a simplified flowchart outlining the basic steps for carrying out a method for forming a contact structure as described above with regard to FIGS. 26-43. At step 392 a stack 330 of alternating active and insulating layers 202 and 204 is formed. Stack 330 is then etched at step 394 to expose sections 338, 342 and 344 of the upper boundary active layers 202.1 of sub stacks 252. Sections 338, 342 and 344 are also referred to as surface areas 338, 342 344. At step 396 these exposed sections are etched to expose active layers 202.2, 202.3 and 202.4 below the upper boundary active layers 202.1 and to create a stairstep structure. An insulation layer 360 is formed on the stairstep structure at step 398. The insulation layer 360 is covered with an insulating material 362 at step 400. At step 402 vias 368 are formed through the insulating material 362 and the insulating layer 360. Interlayer conductors 372 are formed within the vias 368 at step 404 to create contact structure 370.

Figure 46:
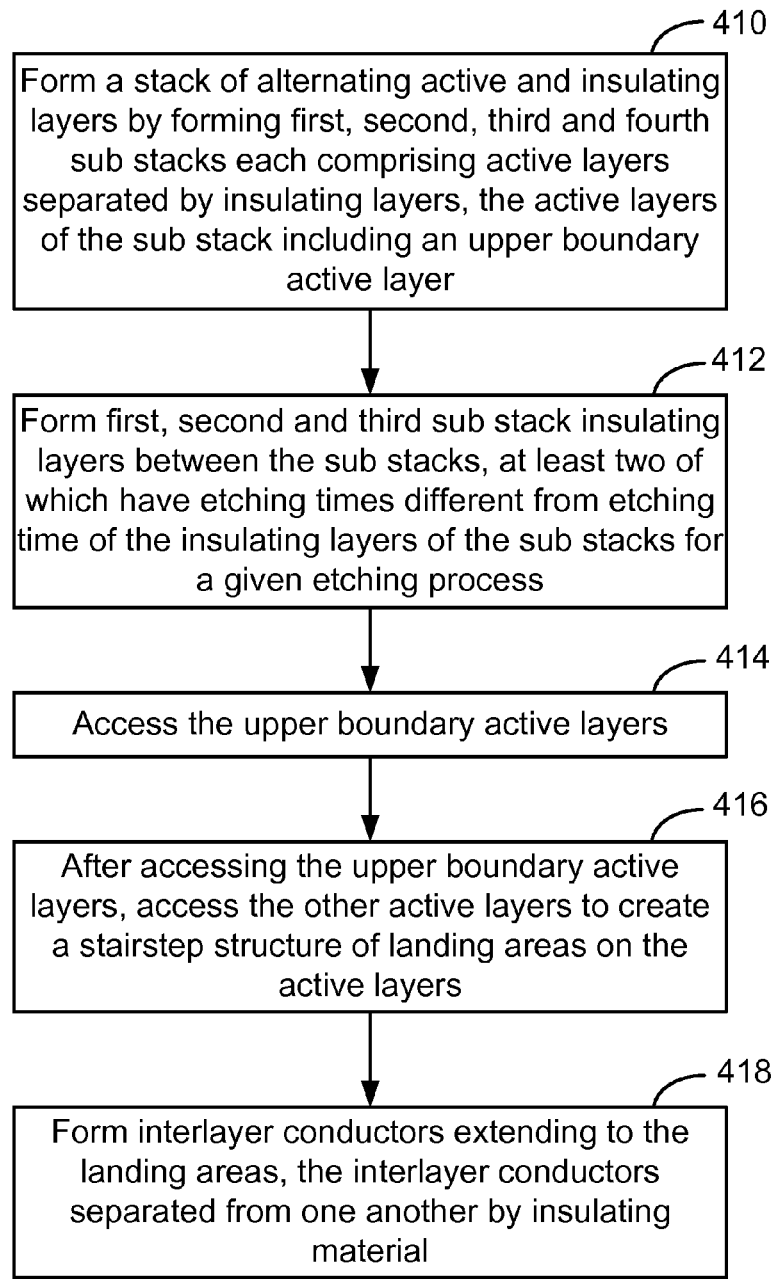
FIG. 46 is a simplified flowchart outlining the steps carrying out the method for forming a contact structure described below with regard to FIGS. 7-25 and FIGS. 26-43.

FIG. 46 is a simplified flowchart outlining the basic steps for carrying out a method for forming a contact structure as described above with regard to FIGS. 7-25 and FIGS. 26-43. In step 410, a stack 200, 380 of alternating active and insulating layers 202 and 204 is formed by forming first, second, third and fourth sub stacks 252 each comprising active layers 202 separated by insulating layers 204. The active layers 202 of each sub stack include an upper boundary active layer 202.1. At step 412, first, second and third sub stack insulating layers 256, 258 and 260 are formed between the sub stacks 252, at least two of which have etching times different from the etching time of the insulating layers 204 of the sub stacks for a given etching process. The upper boundary active layers 202.1 are accessed at step 414. After accessing the upper boundary active layers 202.1, the other active layers 202.2-202.4 are accessed at step 416 to create a stairstep structure such as shown in FIGS. 22 and 42. At step 418, interlayer conductors 272 are formed to extend to the landing areas 310, 358, the interlayer conductors separated from one another by insulating material.

Figure 47:
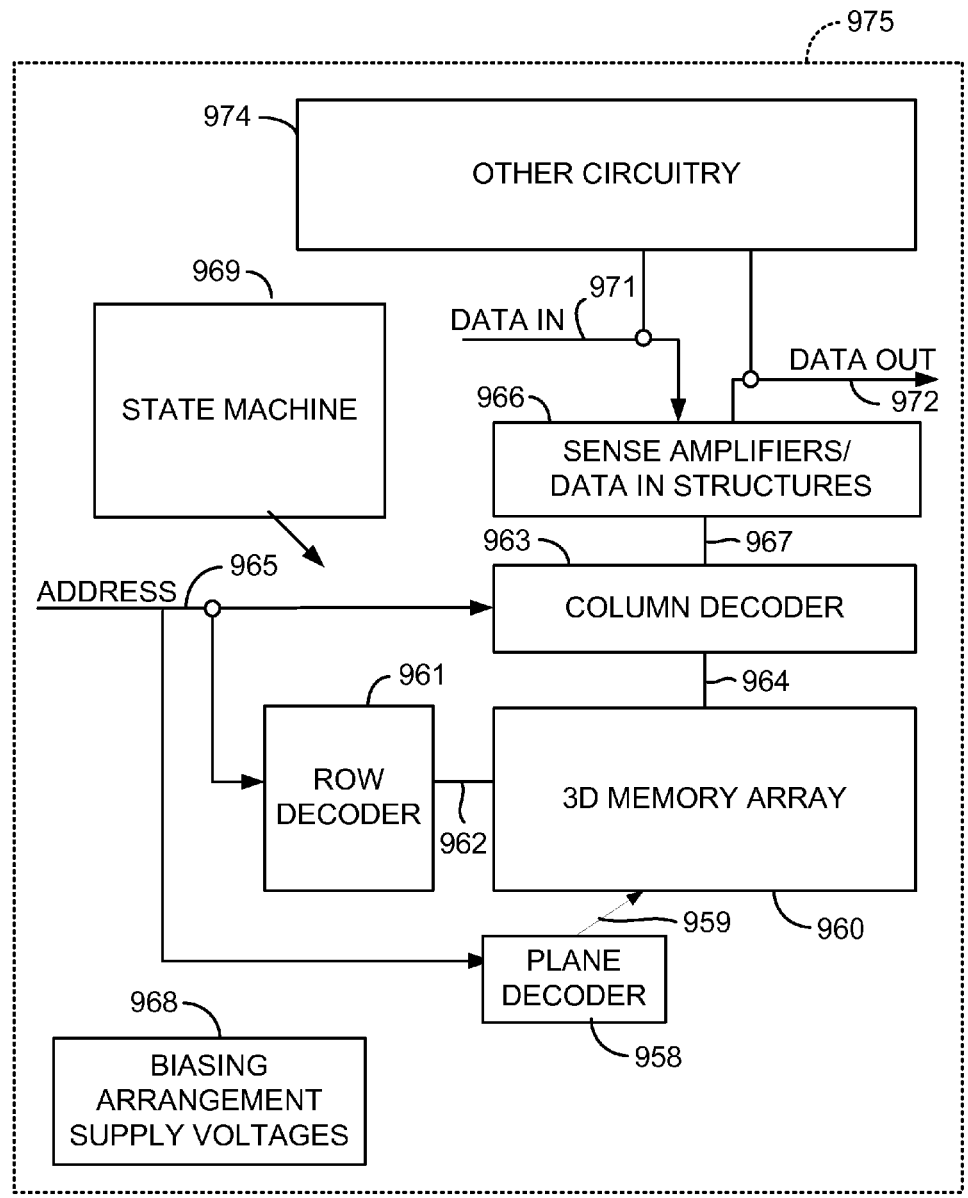
FIG. 47 is a simplified block diagram of an integrated circuit.

FIG. 47 is a simplified block diagram of an integrated circuit. The integrated circuit 975 includes a 3D NAND flash memory array 960, having a structure like that of FIG. 1, for example, on a semiconductor substrate with high density and narrow pitch global bit lines. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963, in this example, via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented, in this example, using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

In various embodiments, a 3D array of devices, for example, memory devices, is provided. The 3D array of devices includes a plurality of patterned layers of semiconductor material. Each patterned layer includes parallel strips of semiconductor material with one of their ends connected to a first side of a semiconductor pad. The semiconductor pads connected to the plurality of patterned layers are disposed in a stack. Each of the semiconductor pads includes a landing area for an interlayer conductor connected to an overlying interconnect conductor aligned along the parallel strips of semiconductor material. The interlayer conductors are arranged in rows in a top view and disposed in a via structure surrounded by an insulating material. Each of the rows is aligned along an X direction, parallel to the first side. In various embodiments, the interlayer conductors can be partially offset in a Y direction, perpendicular to the X direction. In various embodiments, the landing areas can be formed in various types of stair step arrangements, such as illustrated in FIG. 6 and FIG. 43.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A stairstep contact structure comprising:
   a stack of alternating active layers and insulating layers having non-simple periods;
   a stairstep structure of landing areas on the active layers; and
   interlayer conductors extending to the landing areas, the interlayer conductors separated from one another by insulating material.

2. The stairstep contact structure according to claim 1, wherein the stack of alternating active layers and insulating layers comprises:
   a first sub stack comprising N active layers separated by insulating layers, the N active layers comprising an upper boundary active layer;
   a second sub stack over the first sub stack, the second sub stack comprising M active layers separated by insulating layers, the M active layers comprising an upper boundary active layer; and
   a first sub stack insulating layer between the first and second sub stacks, the first sub stack insulating layer having an etching time different from the etching times of the insulating layers of the second sub stack for a given etching process.

3. The stairstep contact structure according to claim 2, wherein the stack comprises:
   third and fourth sub stacks;
   a second sub stack insulating layer between the second and third sub stacks;
   a third sub stack insulating layer between the third and fourth sub stacks; and wherein:
   the insulating layers of the first, second, third and fourth sub stacks have substantially equal thicknesses and are made of a first insulating material;
   the first, second and third sub stack insulating layers are made of a second, third and fourth insulating materials; and
   at least two of the first, second, third and fourth insulating materials are of different insulating materials having different etching characteristics.

4. The stairstep contact structure according to claim 3, wherein:
   the insulating layers of each of the first, second, third and fourth sub stacks have substantially equal etching times for a given etch process; and
   each of the first, second and third sub stack insulating layers having an etching time different from the etching times of the insulating layers of the first, second, third and fourth sub stacks for the given etch process.

5. The stairstep contact structure according to claim 4, where the etching times for the first and third sub stack insulating layers are substantially equal for the given etch process.

6. The stairstep contact structure according to claim 1, wherein for the same etch process at least one of (1) the active layers have different etch times, or (2) the insulating layers have different etch times.

* * * * *